United States Patent
Suzuki et al.

(10) Patent No.: US 9,107,334 B2
(45) Date of Patent: Aug. 11, 2015

(54) CERAMIC SUBSTRATE AND METHOD OF MANUFACTURING THE SAME

(71) Applicant: NGK SPARK PLUG CO., LTD., Nagoya-shi, Aichi-ken (JP)

(72) Inventors: Kenji Suzuki, Ichinomiya (JP); Yuma Otsuka, Komaki (JP); Takakuni Nasu, Komaki (JP)

(73) Assignee: NGK SPARK PLUG CO., LTD., Nagoya (JP)

(*) Notice: Subject to any disclaimer, the term of this patent is extended or adjusted under 35 U.S.C. 154(b) by 213 days.

(21) Appl. No.: 13/669,913

(22) Filed: Nov. 6, 2012

(65) Prior Publication Data
US 2013/0112461 A1    May 9, 2013

(30) Foreign Application Priority Data

Nov. 8, 2011    (JP) .................. 2011-244427

(51) Int. Cl.
*H05K 1/03*    (2006.01)
*H05K 3/10*    (2006.01)
(Continued)

(52) U.S. Cl.
CPC ............ *H05K 3/4638* (2013.01); *H05K 3/4629* (2013.01); *H05K 2201/09063* (2013.01)

(58) Field of Classification Search
USPC .................................... 174/255, 258; 156/278
See application file for complete search history.

(56) References Cited

U.S. PATENT DOCUMENTS 4,970,587 A    11/1990    Abe
6,109,840 A *  8/2000    Raiteri ............................. 408/3
6,148,900 A * 11/2000    Yamasaki et al. ............... 164/80
(Continued)

FOREIGN PATENT DOCUMENTS

JP    S61-20051 U    2/1986
JP    H02-146648 A   12/1990
(Continued)

OTHER PUBLICATIONS

Presentation of publications and the like (Third Party Submission), (identitiy of Submitter omitted), received in corresponding Japanese application No. 2011-244427, Date of submission: Jan. 22, 2015.
(Continued)

*Primary Examiner* — Timothy Thompson
*Assistant Examiner* — Charles Pizzuto
(74) *Attorney, Agent, or Firm* — Stites & Harbison PLLC; Jeffrey A. Haeberlin; James R. Hayne

(57) ABSTRACT

A ceramic substrate includes: a substrate body formed by laminating a plurality of ceramic layers and including a first and second opposing principal surfaces and a peripheral portion having a positioning portion; a first conductor pad formed on the first principal surface; a second conductor pad formed on the second principal surface and having a diameter smaller than that of the first conductor pad. The positioning portion includes first and second through holes that individually pass through respective ceramic layers and are connected to each other in an axial direction. The first through hole passes through the first principal surface. The second through hole passes through the second principal surface and has a cross-sectional area that is smaller than that of the first through hole. At least apart of a peripheral edge of a ceramic layer defining the second through hole is visible through the first through hole.

10 Claims, 27 Drawing Sheets

(51) Int. Cl.
*H05K 1/11* (2006.01)
*H05K 3/46* (2006.01)

(56) References Cited

U.S. PATENT DOCUMENTS

2002/0122301 A1* 9/2002 Sakai .......................... 361/748
2006/0091510 A1* 5/2006 Liu et al. .................... 257/678

FOREIGN PATENT DOCUMENTS

| JP | 03205857 A | * | 9/1991 | ............. H01L 23/28 |
| JP | H10-335822 A | | 12/1998 | |
| JP | 2001-339160 A | | 12/2001 | |
| JP | 2001-352198 A | | 12/2001 | |
| JP | 2001339160 A | * | 12/2001 | ............... H05K 3/46 |
| JP | 2003-298233 A | | 10/2003 | |
| JP | 2006-185965 A | | 7/2006 | |
| JP | 2010-258189 A | | 11/2010 | |

OTHER PUBLICATIONS

Japanese Patent Office, Notification of Reason for Rejection, issued in corresponding Japanese Patent Application No. 2011-244427, dispatched May 19, 2015.

* cited by examiner

CERAMIC SUBSTRATE AND METHOD OF MANUFACTURING THE SAME

CROSS REFERENCE TO RELATED APPLICATIONS

The present application claims priority from Japanese Patent Application No. 2011-244427, which was filed on Nov. 8, 2011, the disclosure of which is herein incorporated by reference in its entirety.

BACKGROUND OF THE INVENTION

1. Field of the Invention

The present invention relates to a ceramic substrate that has a small relative misalignment between conductor layers formed on the surface and the back of a substrate body made of ceramic and includes the conductor layers formed with high positional accuracy, and a method of manufacturing the ceramic substrate.

2. Description of Related Art

To reduce a misalignment between layers of a plurality of ceramic green sheets and to suppress the deterioration of electrical characteristics caused by the misalignment of wiring patterns between the layers, there is proposed a method of manufacturing a ceramic multilayer wiring board. The method includes a first process for forming a plurality of print positioning/reading recognition holes in a ceramic green sheet becoming the lowermost layer later; a second process for detecting print positions by image processing on the basis of the recognition holes as the reference and printing wiring patterns on the surface of the green sheet; a third process for temporarily attaching a ceramic green sheet, which forms the next layer including windows larger than the recognition holes at the positions corresponding to the positions of the recognition holes in advance, to the green sheet; and a fourth process for detecting print positions by image processing through the windows on the basis of the recognition holes as the reference and printing wiring patterns on the surface of the green sheet forming the next layer. Further, in the method, wiring patterns are printed on a required number of ceramic green sheets through the repetition of the third and fourth processes (for example, see JP-A-2001-339160 (pages 1 to 7, FIGS. 1 (1) to (5)).

However, according to the method of manufacturing the ceramic wiring substrate, it is possible to accurately set the print positions of the wiring patterns between the plurality of green sheets but it is very difficult to accurately form a conductor layer at each predetermined position in plan view on both the surface and the back of the substrate body where a plurality of ceramic layers are laminated.

For example, in the above-mentioned method, it is very difficult to form conductor layers at the same positions in plan view on both the surface and the back of the substrate body with high positional accuracy.

BRIEF SUMMARY OF THE INVENTION

The invention has been made to solve the problem described in the background art, and an object of the invention is to provide a ceramic substrate that has a small misalignment between conductor layers formed on the surface and the back of a substrate body made of ceramic, that is, a small misalignment between patterns of conductor layers formed on the surface and back, and a method of reliably manufacturing the substrate.

The invention is made from an idea that the same positioning portions are used as the reference when conductor layers having different sizes are individually formed on the surface and the back of a substrate body made of ceramic.

That is, according to a first aspect of the invention, there is provided a ceramic substrate including a substrate body that is formed by laminating a plurality of ceramic layers and includes a pair of principal surfaces (a first principal surface and a second principal surface on an opposing side of the substrate body); first conductor layers (first conductor pads) that are formed on one principal surface of the pair of principal surfaces (the first principal surface); second conductor layers (second conductor pads) which are formed on the other principal surface of the pair of principal surfaces (the second principal surface) and in each of which the diameter or the shortest length in plan view is smaller than that of the first conductor layers (first conductor pads); conductor posts that are connected to at least one of the first and second conductor layers (first and second conductor pads) and are formed in the substrate body; and a plurality of positioning portions that are formed at a peripheral portion of the substrate body in plan view. At least one of the positioning portions is formed of (defines) a continuous hole including first and second through holes that individually pass through (are each defined by) the respective ceramic layers, have different cross-sectional areas, and are connected to (in communication with) each other in an axial direction. When seen from the side, which corresponds to the principal surface, of the second through hole passing through the ceramic layer that includes the principal surface on which the second conductor layers are formed, the cross-sectional area of the second through hole is smaller than the cross-sectional area of the first through hole that passes through the ceramic layer including the principal surface on which the first conductor layers are formed. In other words, the second hole passes through the second principal surface and has a transverse cross-sectional area that is smaller than a transverse cross-sectional area of the first through hole. At least a part of an inner peripheral surface of the second through hole that passes through the ceramic layer including the principal surface on which the second conductor layers are formed is seen in plan view from the principal surface of the ceramic layer including the principal surface on which the first conductor layers are formed. In other words, at least apart of an inner peripheral surface of a ceramic layer defining the second through hole is visible through the first through hole.

According to this, the first and second conductor layers, which are individually positioned on the pair of principal surfaces of the substrate body and individually connected to the conductor posts, are formed while the centers or the centroids of the inner peripheral surfaces of the second through holes of the plurality of positioning portions, which can be seen through the first through holes or directly from the principal surface of the ceramic layer on which the second conductor layers are formed, or the centers or the centroids specified by at least a part of the inner peripheral surfaces are used as the reference. Accordingly, even though the substrate body includes the plurality of ceramic layers and has a slight misalignment generated in a laminating between these ceramic layers, a misalignment between the first and second conductor layers individually formed on the pair of principal surfaces (the surface and the back) is reduced. That is, the positional accuracies of the first and second conductor layers are increased, respectively. Further, the conduction between the conductor posts which are formed in the substrate body and of which end portions are exposed to the principal surfaces, or the conduction between the internal conductor layers that are positioned between the ceramic layers of the substrate body is stable in the ceramic substrate.

Meanwhile, the ceramic substrate includes not only a multi-piece ceramic substrate but also a one-piece substrate.

Further, the substrate body includes a substrate body that further includes a single ceramic layer or plurality of ceramic layers interposed between a pair of ceramic layers forming the outermost layers, other than a substrate body that individually includes a pair of principal surfaces and is formed of at least two ceramic layers. The pair of principal surfaces is a relative name that means one of the surface and the back of the substrate body.

Furthermore, the periphery of the substrate body includes the periphery of each ceramic wiring substrate or an edge portion of the multi-piece ceramic substrate that surrounds the periphery of the product region includes a plurality of ceramic wiring substrates longitudinally and laterally adjacent to each other.

Moreover, the first and second conductor layers of which the shortest lengths in plan view are different from each other are distinguished from each other by a difference in the length of one side of a square shape or a short side of a rectangular shape, for example, in the case of the rectangular shape (and a square shape) in plan view.

Further, the ceramic includes, for example, high-temperature fired ceramic, such as alumina, mullite or aluminum nitride or glass-ceramic that is a kind of low-temperature fired ceramic.

Furthermore, the conductor post includes, for example, a via conductor and a through hole conductor.

Moreover, the first through hole is a hole that has a size where at least a part of an inner peripheral surface (circumferential surface) of the first through hole in plan view can be seen and passes through the ceramic layer in a circular shape, an oval shape, an elliptical shape, a regular polygonal shape having four or more sides, or a modified polygonal shape in plan view.

In addition, at least a part of the inner peripheral surface of the second through hole is an arc-shaped peripheral edge which is greater than 50% and from which the center of the circular shape or an arc shape of the second through hole in plan view can be recognized.

Further, in the aspect of the invention, the inner peripheral surface of the second through hole may be a circular peripheral edge or a polygonal peripheral edge in plan view.

According to this, there is provided a ceramic substrate that has a small misalignment between the first and second conductor layers formed at predetermined positions on the pair of principal surfaces of the substrate body while the center or the centroid of each of the second through holes of the plurality of positioning portions is used as the reference.

Meanwhile, the polygonal shape includes a regular polygonal shape having three or more equal sides, or a modified polygonal shape having four or more sides.

Moreover, according to a second aspect of the invention, there is provided a ceramic substrate including a substrate body that is formed by laminating a plurality of ceramic layers and includes a pair of principal surfaces (a first principal surface and a second principal surface on an opposing side of the substrate body from the first principal surface); first conductor layers (pads) that are formed on one principal surface of the pair of principal surfaces; second conductor layers (pads) which are formed on the other principal surface of the pair of principal surfaces and in each of which the diameter or the shortest length in plan view is smaller than that of the first conductor layer; conductor posts that are connected to at least one of the first and second conductor layers and are formed in the substrate body; and a plurality of positioning portions that are formed at a peripheral portion of the substrate body in plan view. The positioning portion is a continuous notch including first and second notches that are individually formed at the respective ceramic layers, have different areas of cut portions in plan view, and are connected to each other in the thickness direction of the respective ceramic layers. When seen from the side, which corresponds to the principal surface, of the second notch positioned at the ceramic layer that includes the principal surface on which the second conductor layers are formed, the area of the cut portion of the second notch is smaller than the area of the cut portion of the first notch that is positioned at the ceramic layer including the principal surface on which the first conductor layers are formed. In other words, the second notch passes through the second principal surface and has a transverse cross-sectional area that is smaller than a transverse cross-sectional area of the first notch. At least a part of an edge surface of the second notch that is positioned at the ceramic layer including the principal surface on which the second conductor layers are formed can be seen in plan view from the principal surface of the ceramic layer including the principal surface on which the first conductor layers are formed. In other words, at least a part of an edge surface of a ceramic layer defining the second notch is visible through the first notch.

According to this, the first and second conductor layers, which are individually positioned on the pair of principal surfaces of the substrate body and individually connected to the conductor posts, are formed while the centers or the centroids of the edge surfaces of the second notches of the plurality of positioning portions, which can be seen through the first notches or directly from the principal surface of the ceramic layer on which the second conductor layers are formed, or the centers or the centroids specified by at least a part of the edge surfaces are used as the reference. Accordingly, even though the substrate body includes the plurality of ceramic layers and has a slight misalignment generated in a laminating between these ceramic layers, a misalignment between the first and second conductor layers individually formed on the pair of principal surfaces (the surface and the back) of the substrate body is reduced. That is, the positional accuracies of the first and second conductor layers are increased, respectively. Further, the conduction between the conductor posts which are formed in the substrate body and of which end portions are exposed to the principal surfaces, or the conduction between the internal conductor layers that are positioned between the ceramic layers of the substrate body is stable in the ceramic substrate.

Meanwhile, the ceramic substrate includes not only a multi-piece ceramic substrate but also a one-piece substrate.

Furthermore, the first notch is a portion which has a size where a part of an arc side of the second notch in plan view can be seen, has a semicircular shape, a semi-elliptical shape, a regular polygonal shape having three or more sides, or a modified polygonal shape in plan view, and is opened at one side of the green sheet, and of which an opening portion overlaps the opening portion of the notch in plan view.

Moreover, each of the first and second notches is opened at one side or corner of the green sheet and the width and depth of the first notch are different from those of the second notch in plan view. Accordingly, the areas of the cut portions of the first and second notches are different from each other.

Further, the edge surface of the second notch means an arc-shaped surface that is interposed between a pair of parallel flat surfaces opened at the outer surface of each ceramic layer; three surfaces, that is, the pair of parallel flat surfaces and a vertical surface interposed between the pair of flat surfaces; or two vertical surfaces obliquely crossing each other.

In addition, as long as the first notch is opened at the outer surface of the ceramic layer and at least a part of the edge surface of the second notch can be seen, the shape of the first notch in plan view is not particularly limited.

Further, in the aspect of the invention, the edge surface included in the second notch may show an arc-shaped edge side, which is at least one-sixth or more of a circular shape forming a base in plan view, a semioval edge side, a semi-elliptical edge side, or two or more edge sides crossing each other in plan view.

According to this, while the centers or the centroids of the edge surfaces of the respectively second notches of the plurality of positioning portions are used as the reference, the first and second conductor layers are individually and accurately formed at predetermined positions on the pair of principal surfaces of the substrate body in the ceramic substrate.

Meanwhile, in the case of an arc-shaped edge surface, the reason that the second notch includes an arc-shaped portion, which is at least one-sixth or more of a circular shape forming a base in plan view, is that the center of the arc-shaped surface can be specified by image processing or the like in the above-mentioned range or more. It is preferable that the arc-shaped portion correspond to a quarter or more of a circular shape forming a base. Further, the second notch is not limited to a U shape that is an arc shape where the edge surface is positioned on the inner side. The second notch may include two or more flat surfaces that have a linear shape in plan view and cross each other so as to have a V shape in plan view, or may include three or two rectangular (square) sides in plan view.

In addition, according to a third aspect of the invention, there is provided a ceramic substrate including a substrate body that is formed by laminating a plurality of ceramic layers and includes a pair of principal surfaces (a first principal surface and a second principal surface on an opposing side of the substrate body from the first principal surface); first conductor layers (pads) that are formed on one principal surface of the pair of principal surfaces; second conductor layers (pads) which are formed on the other principal surface of the pair of principal surfaces and in each of which the diameter or the shortest length in plan view is smaller than that of the first conductor layer; conductor posts that are connected to at least one of the first and second conductor layers (pads) and are formed in the substrate body; and a plurality of positioning portions that are formed at a peripheral portion of the substrate body in plan view. The positioning portion is a stepped portion with a hole including notches and a through hole which are individually formed at the respective ceramic layers and are connected to each other in the thickness direction of the respective ceramic layers, and the cross-sectional area of a cut portion of the notch in plan view is different from the cross-sectional area of the through hole in plan view. When seen from the side, which corresponds to the principal surface, of the through hole positioned at the ceramic layer that includes the principal surface on which the second conductor layers are formed, the cross-sectional area of the through hole is smaller than the area of the cut portion of the notch that is positioned at the ceramic layer including the principal surface on which the first conductor layers are formed. In other words, the through hole passes through the second principal surface and has a transverse cross-sectional area that is smaller than a transverse cross-sectional area of the notch. At least apart of an inner peripheral surface of the through hole that is positioned at the ceramic layer including the principal surface on which the second conductor layers are formed is seen in plan view from the principal surface of the ceramic layer including the principal surface on which the first conductor layers are formed. In other words, at least apart of an inner peripheral surface of a ceramic layer defining the through hole is visible through the notch.

According to this, as in the ceramic substrate according to the first aspect of the invention, the first and second conductor layers are formed while the centers or the centroids of the inner peripheral surfaces of the through holes of the plurality of positioning portions, which can be seen through the notches or directly from the principal surface of the ceramic layer on which the second conductor layers are formed, or the centers or the centroids specified by at least a part of the inner peripheral surfaces are used as the reference. Accordingly, even though the substrate body includes the plurality of ceramic layers and has a slight misalignment generated in a laminating between these ceramic layers, a misalignment between the first and second conductor layers individually formed on the pair of principal surfaces (the surface and the back) of the substrate body is reduced. That is, the positional accuracies of the first and second conductor layers are increased, respectively. Further, the conduction between the conductor posts which are formed in the substrate body and of which end portions are exposed to the principal surfaces, or the conduction between the internal conductor layers that are positioned between the ceramic layers of the substrate body is stable in the ceramic substrate.

Meanwhile, the ceramic substrate includes not only a multi-piece ceramic substrate but also a one-piece substrate.

Furthermore, the first notch of the ceramic substrate according to the second aspect of the invention may be applied to the notch of the ceramic substrate according to the third aspect of the invention, and the second through hole of the ceramic substrate according to the first aspect of the invention may be applied to the through hole of the ceramic substrate according to the third aspect of the invention.

Meanwhile, according to another aspect of the invention, there is provided a method of manufacturing a ceramic substrate including a substrate body that is made of ceramic and includes a pair of principal surfaces, first and second conductor layers which are individually formed on the pair of principal surfaces and of which the diameters or the shortest lengths in plan view are different from each other, and a plurality of positioning portions that are formed at a peripheral portion of the substrate body in plan view. The method includes forming the first and second conductor layers (pads), of which the diameters or the shortest lengths in plan view are different from each other, at predetermined positions on the respective pair of principal surfaces while using the center or the centroid of a through hole and the center or the centroid of an edge surface of a notch of each of the plurality of positioning portions seen in plan view as a reference on each of the principal surfaces of green sheets including the pair of principal surfaces.

According to this, it is possible to form the first and second conductor layers at predetermined positions on the respective principal surfaces (the surface and the back) with high positional accuracy and a small misalignment while the centers or the centroids of the through holes of the plurality of positioning portions, which can be seen from the principal surface, on which the second conductor layers are formed, of the pair of principal surfaces of the green sheets forming the substrate body or the centers or the centroids of the edge surfaces of the notches are used as the reference. Further, it is possible to provide a ceramic substrate that individually includes the first and second conductor layers, which are reliably connected to the conductor posts formed in the green sheets, on the pair of principal surfaces.

Meanwhile, the center or the centroid of the through hole is a virtual position, and the center or the centroid of the edge portion of the notch is also a virtual position.

Furthermore, the centers or the centroids of the second through holes, and the centers or the centroids of the edge surfaces of the second notches are recognized by detecting the second through holes or the second notches with a photo sensor, a CCD camera, or the like that is directed to or images the principal surface of the green sheet. While a plurality (at least three or more) of the centers are used as the reference, the conductor layers are formed at predetermined positions on the principal surfaces by screen printing.

Further, in the aspect of the invention, the substrate body may be formed by laminating a plurality of ceramic layers. The positioning portion may be a continuous hole including first and second through holes that individually pass through a plurality of green sheets forming the respective ceramic layers, have different cross-sectional areas, and are connected to each other in an axial direction; a continuous notch including first and second notches that are individually formed at a plurality of green sheets forming the respective ceramic layers, have different areas of cut portions in plan view, and are connected to each other in the thickness direction of the respective green sheets; or a stepped portion with a hole including notches and a through hole which are individually formed at the respective ceramic layers and are connected to each other in the thickness direction of the respective ceramic layers, and the cross-sectional area of a cut portion of the notch in plan view is different from the cross-sectional area of the through hole in plan view.

According to this, it is possible to form the positioning portions of continuous holes including first and second through holes that are connected to each other, continuous notches including first and second notches that are connected to each other, or stepped portions with holes including notches and the through holes that are connected to each other, in the plurality of green sheets forming the substrate body. It is possible to form the first and second conductor layers at predetermined positions on the surface and the back of the substrate body while the centers or the centroids of these second through holes or the second notches are used as the reference. Accordingly, it is possible to reliably manufacture the ceramic substrates according to the first, second, and the third aspects of the invention.

Furthermore, in the aspect of the invention, the second through hole of which the inner diameter or the cross-sectional area is smaller than that of the first through hole or the second notch of which the area of the cut portion is smaller than that of the first notch may be formed in a green sheet of a reference layer where the second conductor layers in each of which the diameter or the shortest length in plan view is smaller than that of the first conductor layer are formed on the principal surface, among the green sheets forming the plurality of ceramic layers.

According to this, the second through holes or the second notches including the centers or the centroids, which are used as the reference for the positioning of the respective conductor layers, are formed in the green sheet that forms the reference layer where the second conductor layers in each of which the area is smaller than the area of the first conductor layer are formed on the principal surface. As a result, since it is possible to accurately set a distance between the second conductor layer having a relatively small area and the second through hole or the second notch, it is easy to accurately set positions, where the first conductor layers having a relatively large area are to be formed, on the principal surface opposite to the side on which the first through holes or the first notches are positioned while the centers or the centroids of the inner peripheral surfaces of the second through holes or the edge surfaces of the second notches are used as the reference.

Moreover, in the aspect of the invention, the second through holes or the second notches and other through holes which are used to form the conductor posts, may be simultaneously formed in the green sheet of the reference layer.

According to this, since the second through holes or the second notches and the through holes in which the conductor posts connected to the second conductor layers are formed later are simultaneously formed in the green sheet of the same reference layer, it is possible to more accurately connect the second conductor layers, which are formed while the centers or the centroids of the second through holes or the second notches are used as the reference, with the conductor posts at predetermined positions.

In addition, in the aspect of the invention, the method may further include making at least a part of an inner peripheral surface of the second through hole or at least a part of an edge surface of the second notch form a first through hole of which the inner diameter or the cross-sectional area seen in plan view is large or a first notch of which the area of a cut portion is large in plan view, on a green sheet other than the green sheet of the reference layer when the green sheet of the reference layer is laminated.

According to this, the first through holes or the first notches, where at least a part of the inner peripheral surfaces of the second through holes or at least a part of the edge surfaces of the second notches can be seen in plan view from the principal surface on which the first conductor layers are formed, are formed in a single green sheet or a plurality of green sheets other than the reference layer. As a result, while the centers or the centroids of the second through holes or the second notches, which can be seen in plan view from the first through holes or the first notches, are used as the reference, it is easy to individually form the first and second conductor layers at predetermined positions on the pair of principal surface of the green sheet laminate, where a plurality of green sheets are laminated, with high positional accuracy. Accordingly, a misalignment between the first and second conductor layers is reduced.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Embodiments of the invention will be described below.

Figure 1:
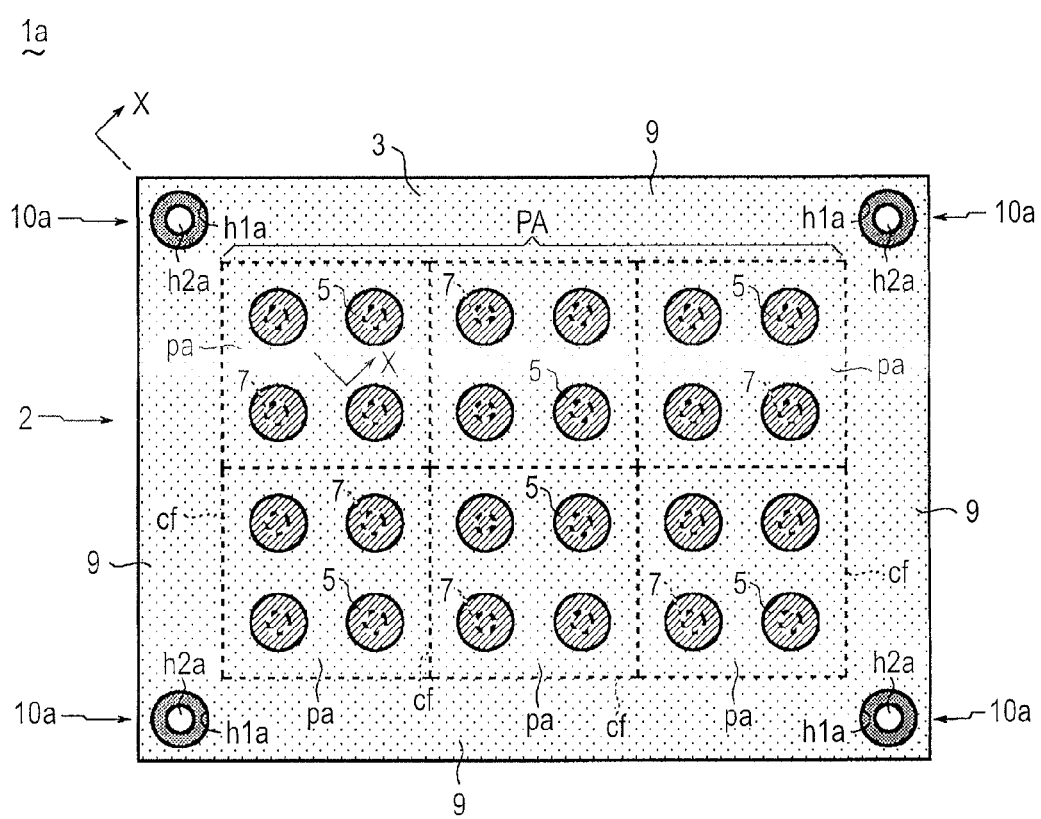
FIG. 1 is a plan view of a first ceramic substrate according to the invention.
Figure 2:
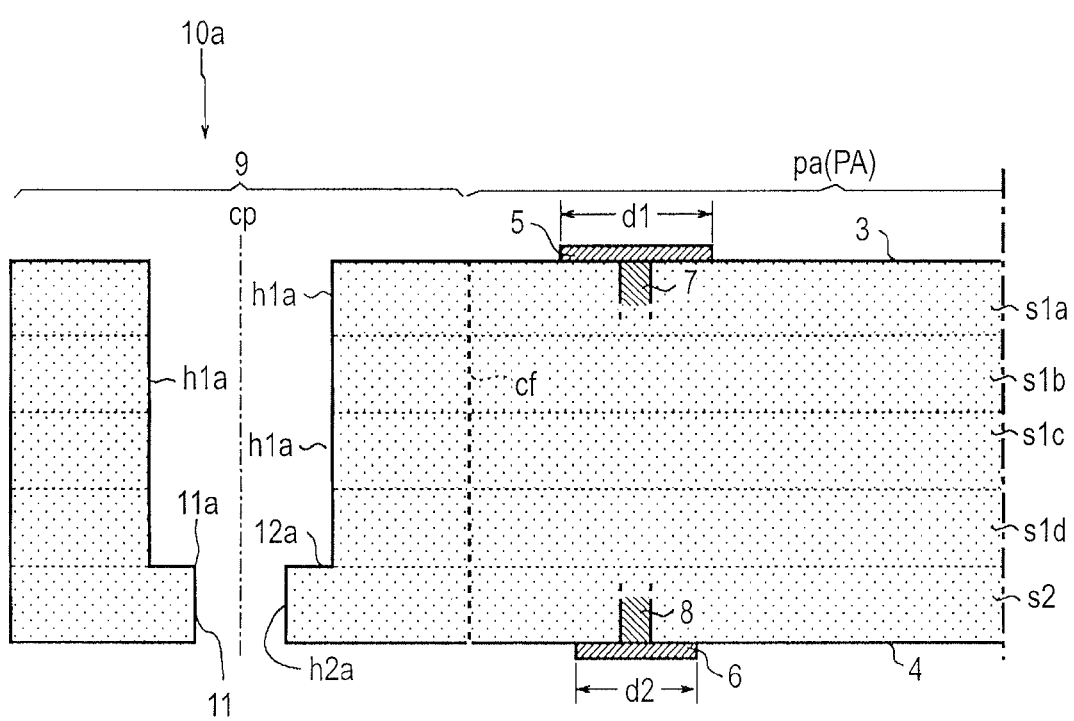
FIG. 2 is a vertical cross-sectional view where a portion taken along line X-X of FIG. 1 is enlarged.

FIG. 1 is a plan view of a first ceramic substrate $1a$ according to the invention, and FIG. 2 is a vertical cross-sectional view where a portion taken along line X-X of FIG. 1 is enlarged.

The first ceramic substrate $1a$ is a multi-piece substrate. As shown in FIGS. 1 and 2, the first ceramic substrate $1a$ includes a substrate body 2, first conductor layers (pads) 5 that are formed on the surface (one principal surface) 3 of the substrate body 2, second conductor layers 6 which are formed on the back (the other principal surface) 4 of the substrate body 2 and each of which has a diameter d2 smaller than a diameter d1 of each first conductor layer 5 in plan view, via conductors (conductor posts) 7 and 8 that are individually connected to the first and second conductor layers 5 and 6 and formed in the substrate body 2, and a plurality of (four) positioning portions $10a$ each of which is formed at each corner portion of an edge portion (peripheral portion) 9 of the substrate body.

Meanwhile, the ceramic substrate $1a$ and second and third ceramic substrates $1b$ and $1c$ to be described below may be one-piece substrates.

As shown in FIGS. 1 and 2, the substrate body 2 is formed by laminating a plurality of ceramic layers $s1a$ to std and s2 that have a rectangular shape in plan view, and includes a pair of surfaces, that is, a surface (principal surface) 3 and a back (principal surface) 4. As shown in FIG. 1, the substrate body 2 includes a product region PA that includes a plurality of ceramic wiring substrate regions pa longitudinally and laterally adjacent to each other and a rectangular frame-like edge portion (peripheral portion) 9 that surrounds the periphery of the product region PA. Portions between the adjacent ceramic wiring substrate regions pa and pa and boundaries between the product region PA and the edge portion 9 are defined as virtual planes cf to be cut that are shown by a broken line. Meanwhile, the ceramic layers $s1a$ to $s1d$ and s2 are made of, for example, high-temperature fired ceramic such as alumina.

Further, each ceramic wiring substrate region pa includes, for example, four first conductor layers 5 on the surface 3 and four second conductor layers 6 on the back 4, respectively. The first and second conductor layers 5 and 6 are individually connected to the via conductors (conductor posts) 7 and 8 formed in the substrate body 2. The diameter d1 of each first conductor layer 5, which has a circular shape in plan view, is larger than the diameter d2 of each second conductor layer 6.

Furthermore, as shown in FIG. 1, a total of four positioning portions $10a$ are disposed at the corner portions of the edge portion 9, respectively. As shown in FIG. 2, each of the positioning portions $10a$ is a continuous hole including first through holes $h1a$ and a second through hole $h2a$ that are connected to each other in an axial direction. The first through holes $h1a$ individually pass through the ceramic layers $s1a$ to std and have a circular cross-section. The second through hole $h2a$ has a circular cross-section and has a cross-sectional area smaller than the cross-sectional area of each of the first through holes $h1a$ in plan view. As shown in FIGS. 1 and 2, an upper peripheral edge (peripheral edge) $11a$, which has a circular shape in plan view, of an inner peripheral surface 11 of the second through hole $h2a$ among these can be seen from the surface 3 of the substrate body 2, and a center cp of the second through hole $h2a$ can also be seen from the surface 3 of the substrate body 2.

Meanwhile, an annular stepped portion $12a$ is positioned between the second through hole $h2a$ having a relatively small diameter and the first through hole $h1a$ having a relatively large diameter.

Figure 3:
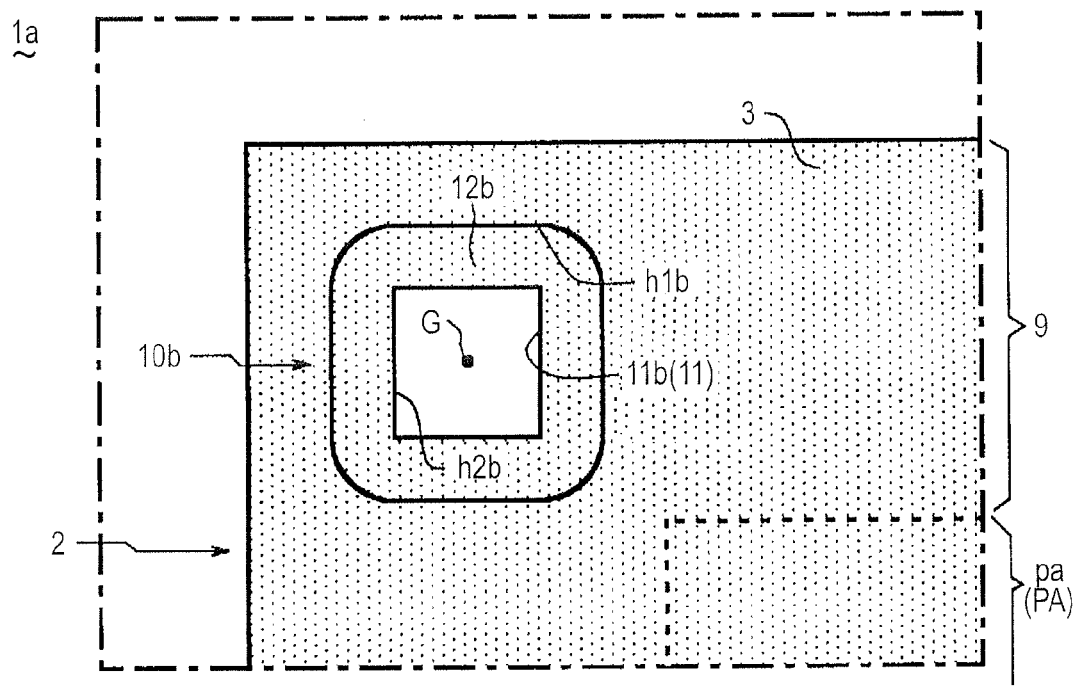
FIG. 3 is an enlarged plan view of a peripheral portion of the substrate where another type of positioning portion is formed.

Moreover, FIG. 3 is a partial plan view of another type of positioning portion $10b$ that can be applied to the ceramic substrate $1a$. As shown in FIG. 3, the positioning portion $10b$ is a continuous hole including first through holes $h1b$ and a second through hole $h2b$ that are concentrically connected to each other in an axial direction. The first through holes $h1b$ individually pass through the ceramic layers $s1a$ to $s1d$ and have a substantially square cross-section of which four corners are rounded. The second through hole $h2b$ has a square cross-section and has a cross-sectional area smaller than the cross-sectional area of each of the first through holes $h1b$ in plan view. As shown in FIG. 3, an upper peripheral edge $11b$, which has a square shape in plan view, of an inner peripheral surface 11 of the second through hole $h2b$ among these can be seen from the surface 3 of the substrate body 2, and a centroid G of the second through hole $h2b$ can also be seen from the surface 3 of the substrate body 2. Meanwhile, a substantially quadrangular frame-like stepped portion $12b$ is positioned between the second through hole h2b having a relatively small diameter and the first through hole h1b having a relatively large diameter.

Figure 4:
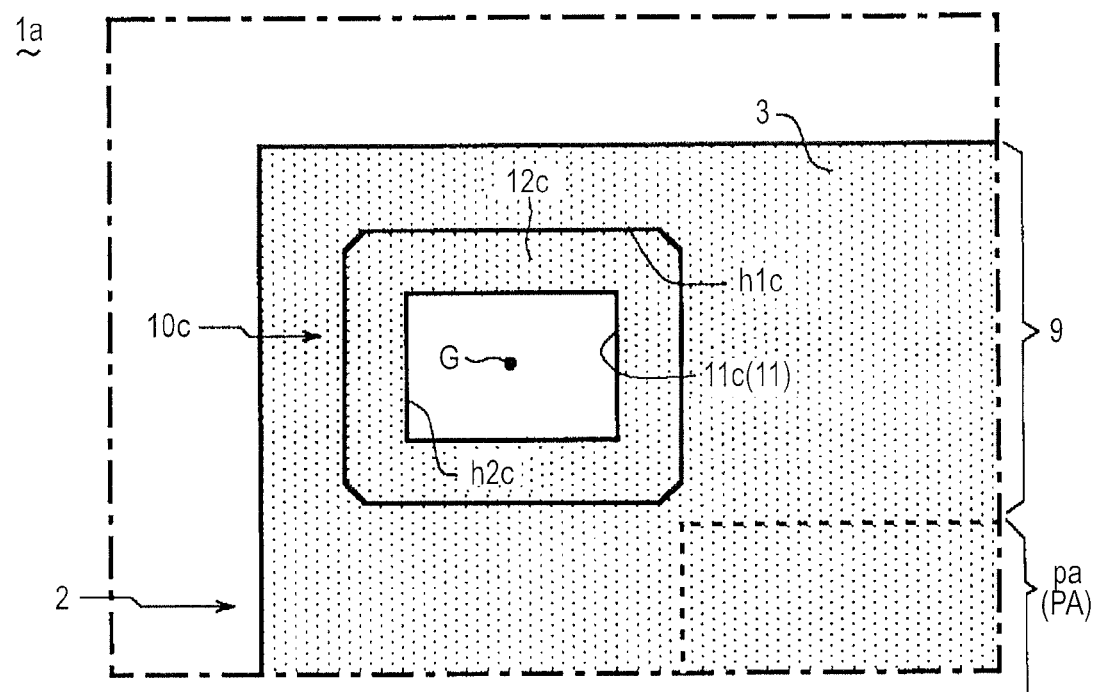
FIG. 4 is an enlarged plan view of a peripheral portion of the substrate where still another type of positioning portion is formed.

Further, FIG. 4 is a partial plan view of still another type of positioning portion 10c that can be applied to the ceramic substrate 1a. As shown in. FIG. 4, the positioning portion 10c is a continuous hole including first through holes h1c and a second through hole h2c which are connected to each other in an axial direction and of which the orientations of long and short sides are aligned. The first through holes h1c individually pass through the ceramic layers s1a to s1d and have a substantially rectangular cross-section of which four corners include oblique sides. The second through hole h2c has a square cross-section and has a cross-sectional area smaller than the cross-sectional area of each of the first through holes h1c in plan view. As shown in FIG. 4, an upper peripheral edge 11c, which has a rectangular shape in plan view, of an inner peripheral surface 11 of the second through hole h2c among these can be seen from the surface 3 of the substrate body 2, and a centroid G of the second through hole h2c can also be seen from the surface 3 of the substrate body 2. Meanwhile, a substantially rectangular frame-like stepped portion 12c is positioned between the second through hole h2c and the first through hole h1c.

Figure 5:
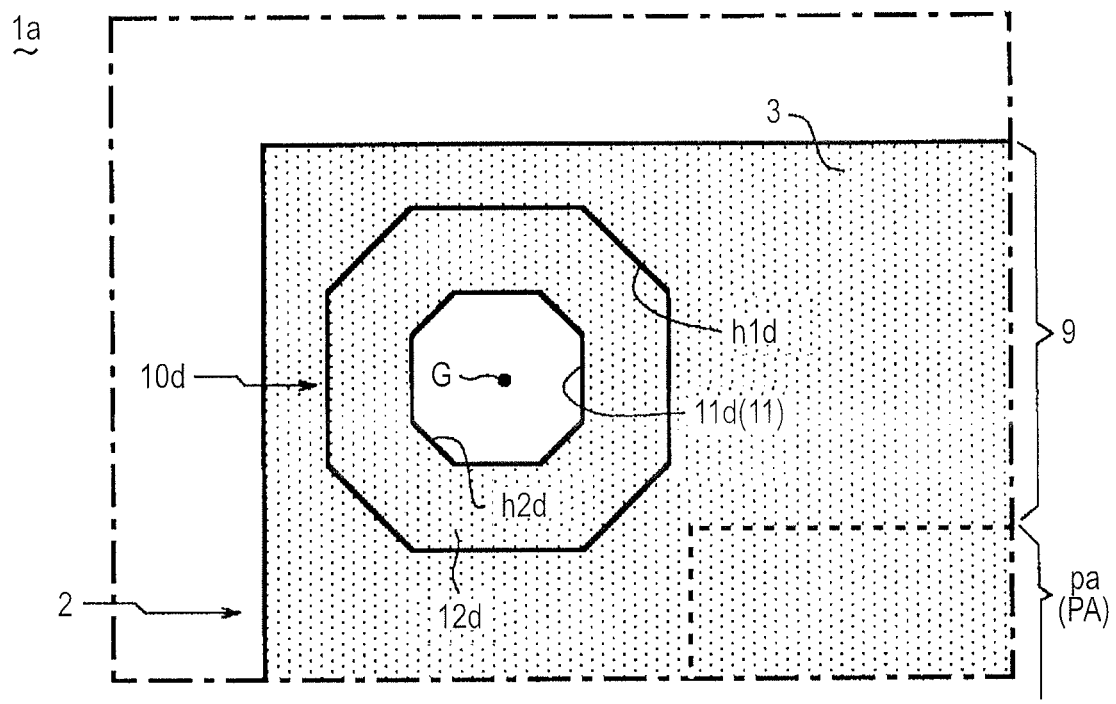
FIG. 5 is an enlarged plan view of a peripheral portion of the substrate where yet another type of positioning portion is formed.

Furthermore, FIG. 5 is a partial plan view of another type of positioning portion 10d that can be applied to the ceramic substrate 1a. As shown in FIG. 5, the positioning portion 10d is a continuous hole including first through holes hid and a second through hole h2d which are connected to each other in an axial direction and of which the orientations are the same. The first through holes hid individually pass through the ceramic layers s1a to s1d and have a regular octagonal cross-section. The second through hole h2d has a regular octagonal cross-section and has a cross-sectional area smaller than the cross-sectional area of each of the first through holes hid in plan view. As shown in FIG. 5, an upper peripheral edge 11d, which has a regular octagonal shape in plan view, of an inner peripheral surface 11 of the second through hole h2d among these can be seen from the surface 3 of the substrate body 2, and a centroid G of the second through hole h2d can also be seen from the surface 3 of the substrate body 2. Meanwhile, an octagonal frame-like stepped portion 12d is positioned between the second through hole h2d and the first through hole h1d.

According to the first ceramic substrate 1a that includes any one of the above-mentioned positioning portions 10a to 10d at each of the corner portions of the edge portion 9, the first and second conductor layers 5 and 6, which are individually positioned on the surface 3 and the back 4 of the substrate body 2 and individually connected to the conductor posts 7 and 8, are formed while the centers cp or the centroids G of the inner peripheral surfaces 11 of the second through holes h2a to h2d of the plurality of positioning portions 10a to 10d, which can be seen through the first through holes h1a to h1d or directly from the back 4 of the ceramic layer s2 on which the second conductor layers 6 are formed, or the centers cp or the centroids G specified by at least major portions (a part) of the inner peripheral surfaces 11 are used as the reference.

Accordingly, even though the substrate body 2 includes the plurality of ceramic layers s1a to s1d and s2 and has a slight misalignment generated in a laminating between these ceramic layers, the positional accuracy of each of the via conductors 7 and 8 formed in the substrate body 2 and the first and second conductor layers 5 and 6 individually formed on the surface 3 and the back 4 of the substrate body 2 is increased. Therefore, it is possible to conduct stably between the first and second conductor layers 5 and 6 and the internal conductor layers that are provided between the ceramic layers s1a to std and s2 of the substrate body 2.

Figure 6:
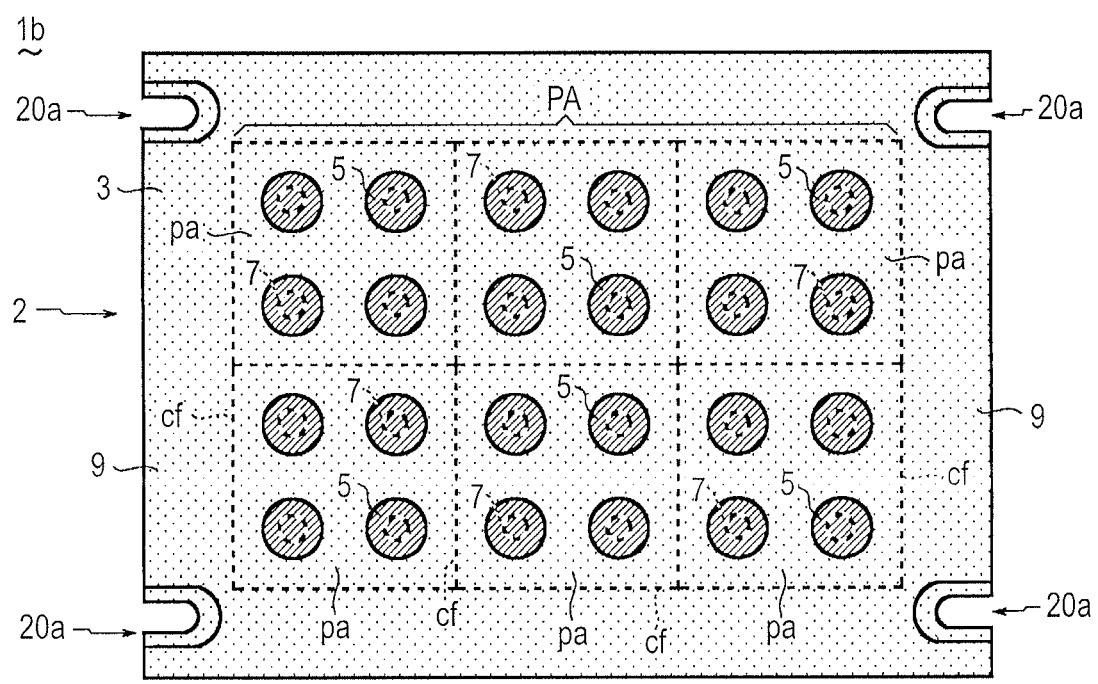
FIG. 6 is a plan view of a second ceramic substrate according to the invention.
Figure 7:
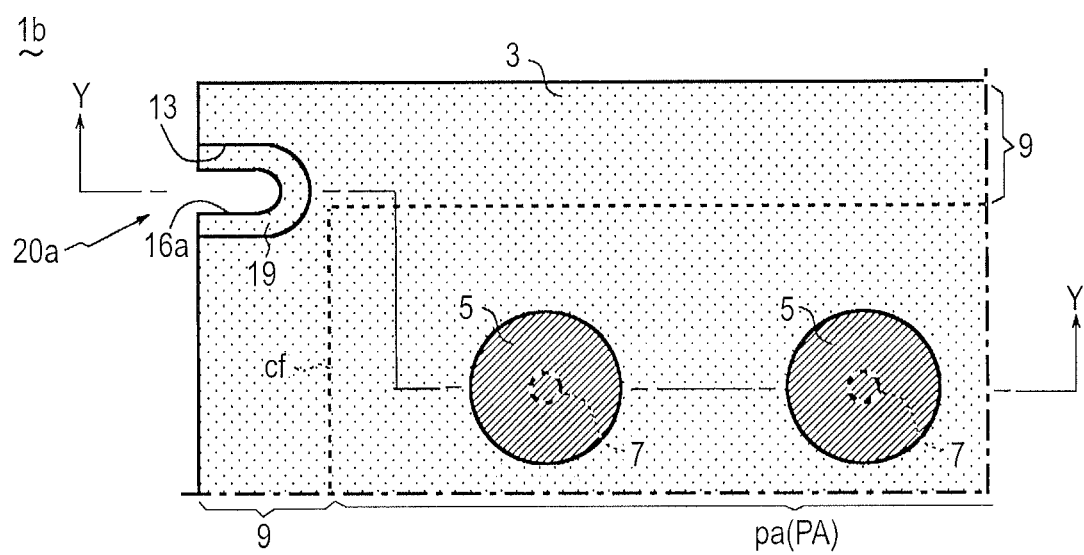
FIG. 7 is a partial plan view where a corner portion of a peripheral portion of the ceramic substrate is enlarged.
Figure 8:
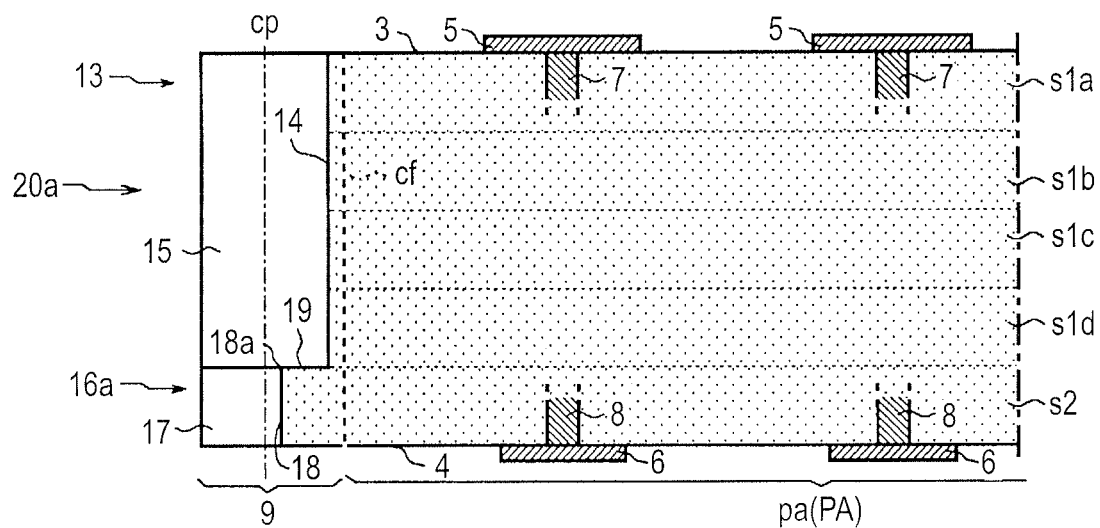
FIG. 8 is a partial vertical cross-sectional view taken along line Y-Y of FIG. 7.
Figure 9:
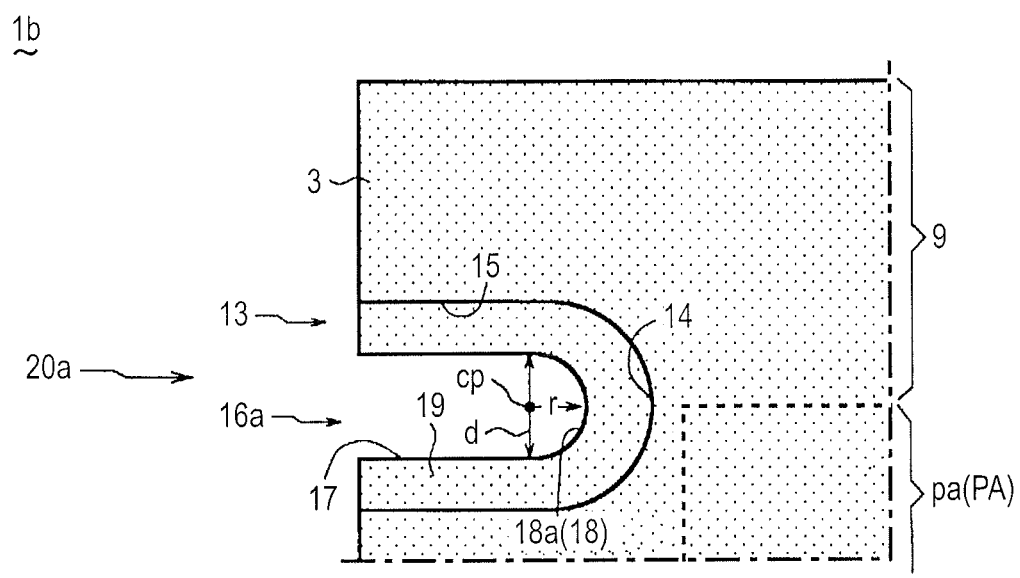
FIG. 9 is a partially enlarged plan view of a positioning portion that is positioned at a peripheral portion of the substrate.

FIG. 6 is a plan view of a second ceramic substrate 1b according to the invention, FIG. 7 is a partial plan view where one corner portion of a peripheral portion of the ceramic substrate 1b is enlarged, FIG. 8 is a partial vertical cross-sectional view taken along line Y-Y of FIG. 7, and FIG. 9 is an enlarged plan view of the corner portion shown in FIG. 7.

As shown in FIGS. 6 to 8, the second ceramic substrate 1b includes a substrate body 2, first conductor layers 5, second conductor layers 6, via conductors 7 and 8, a product region PA including a plurality of ceramic wiring substrate regions pa, an edge portion 9, virtual planes cf to be cut, and a plurality of (four) positioning portions 20a each of which is formed at each corner portion of the edge portion 9. The substrate body 2, the first and second conductor layers 5 and 6, the via conductors 7 and 8, the product region PA, the edge portion 9, and the virtual planes cf are the same as described above.

As shown in FIGS. 8 and 9, the positioning portion 20a is a continuous notch including first notches 13 and a second notch 16a that are connected to each other in an axial direction. The first notches 13 are individually formed at the ceramic layers s1a to s1d and have a U shape in plan view. The second notch 16a has a U shape in plan view, and has the area of a cut portion smaller than the area of a cut portion of the first notch 13 in plan view.

Each of the first notches 13 among these includes flat surfaces 15 that are perpendicular to the outer surface of the substrate body 2 and parallel to each other, and an arc-shaped surface 14 that is positioned on the inner sides of the flat surfaces 15 and has a semicircular shape in plan view. Further, the second notch 16a also includes a pair of flat surfaces 17 that is similar to the flat surfaces 15, and an edge surface 18 that is positioned on the inner sides of the flat surfaces 17 and has a semicircular shape in plan view. As shown in FIG. 9, an upper edge side (edge side) 18a, which has a semicircular shape in plan view, of the edge surface 18 can be seen from the surface 3 of the substrate body 2 and the center cp of the edge surface 18 can also be seen from the surface 3 of the substrate body 2. The upper edge side 18a has a semicircular shape having a diameter d (radius r) in plan view.

Meanwhile, a substantially U-shaped stepped portion 19 is positioned between the relatively small second notch 16a and the relatively large first notch 13.

Figure 10:
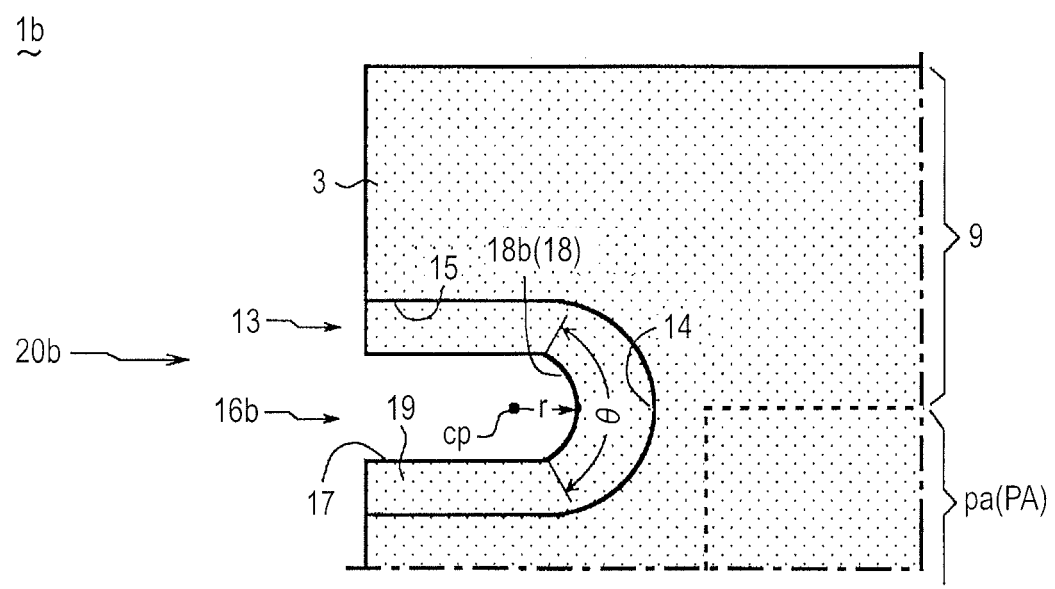
FIG. 10 is a partially enlarged plan view of another type of positioning portion of the substrate.

Furthermore, FIG. 10 is a partial plan view, which is the same as described above, of another type of positioning portion 20b that can be applied to the ceramic substrate 1b.

As shown in FIG. 10, the positioning portion 20b is a continuous notch including first notches 13, which are the same as described above, and a second notch 16b connected to each other in an axial direction. The second notch 16b has a U shape in plan view, and has the area of a cut portion smaller than the area of a cut portion of the first notch 13 in plan view. The second notch 16b includes an edge surface 18. The edge surface 18 is positioned on the inner sides of a pair of flat surfaces 17, which are the same as described above, and has an arc shape in plan view. An edge side 18b, which has an arc shape corresponding to an angle (θ) of about one third of a circular shape forming a base in plan view, of the edge surface 18 can be seen from the surface 3 of the substrate body 2, and a center cp of the edge surface 18 can also be seen from the surface 3 of the substrate body 2. Meanwhile, a substantially U-shaped stepped portion 19 is positioned between the second notch 16b and the first notch 13.

Figure 11:
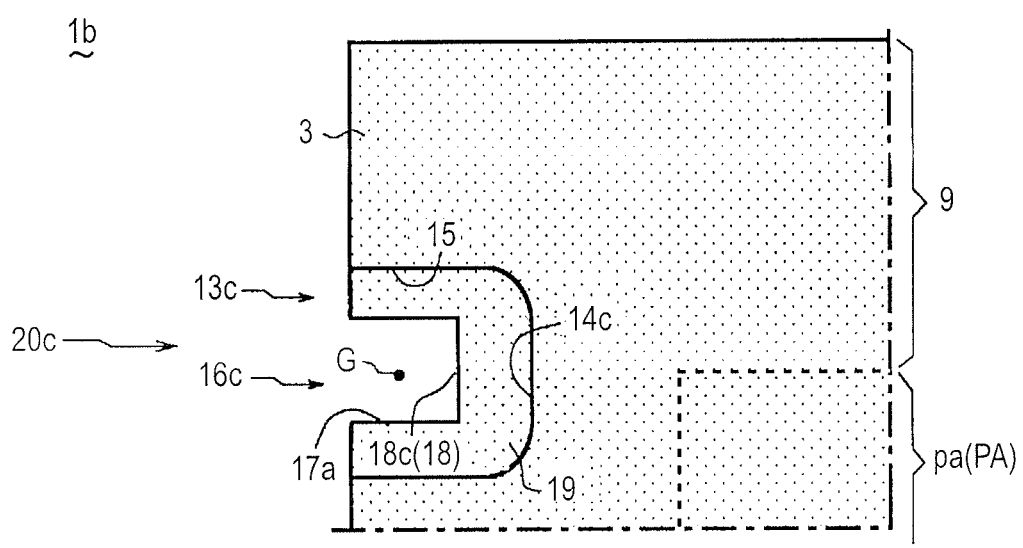
FIG. 11 is a partially enlarged plan view of still another type of positioning portion of the substrate.

Moreover, FIG. 11 is a partial plan view, which is the same as described above, of still another type of positioning portion 20c that can be applied to the ceramic substrate 1b.

As shown in FIG. 11, the positioning portion 20c is a continuous notch including first notches 13c and a second notch 16c that are connected to each other in an axial direction. The first notches 13c are individually formed at the ceramic layers s1a to std and have a U shape in plan view. The second notch 16c has a square shape in plan view, and has the area of a cut portion smaller than the area of a cut portion of the first notch 13 in plan view.

Each of the first notches 13c among these includes flat surfaces 15 that are perpendicular to the outer surface of the substrate body 2 and parallel to each other, a flat surface 14c that is formed on the inner sides of the flat surfaces 15 and orthogonal to the flat surfaces 15 and has a linear shape in plan view, and a pair of rounded surfaces that are positioned between the flat surface 14c and the flat surfaces 15. Meanwhile, the second notch 16c includes a pair of flat edge surfaces 17a, and an edge surface 18 that is formed on the inner sides of the edge surfaces 17a and orthogonal to the edge surfaces 17a and has a linear shape in plan view. The length of each of the edge surfaces 17a is the same as the length of the edge surface 18 in plan view. As shown in FIG. 11, upper edge sides (edge sides) 18a and 18c of the edge surfaces 17a and 18 can be seen from the surface 3 of the substrate body 2 and a centroid G of a (virtual) square, which is formed in plan view by three sides of the edge surface 18 and the pair of edge surfaces 17a, is also the reference that can be seen from the surface 3 of the substrate body 2.

Meanwhile, a substantially U-shaped stepped portion 19 is positioned between the second notch 16c and the first notch 13c. Further, the length of the edge surface 17a may be set to a fraction (for example, one-half or a quarter) of the edge surface 18 in plan view, and a centroid G of the rectangle surrounded by these surfaces may be used as the reference. Alternatively, a centroid G of a virtual square or rectangle that uses the edge surface 18 as one side, that is, a centroid G that is positioned near or outside the outer surface of the substrate body 2 may be used as the reference.

According to the second ceramic substrate 1b that includes any one of the above-mentioned positioning portions 20a to 20c at each of the corner portions of the edge portion 9, the first and second conductor layers 5 and 6, which are individually positioned on the surface 3 and the back 4 of the substrate body 2 and individually connected to the via conductors 7 and 8, are formed while the centers cp of the edge surfaces 18 included in the second notches 16a to 16c of the positioning portions 20a to 20c of the plurality of positioning portions 20a to 20c, which can be seen through the first notches 13 or directly from the surface 3 of the ceramic layer s1a on which the first conductor layers 5 are formed, the centroids G of the entire second notches 16c (edge surfaces 17a and 18), or the centroids G specified by at least major portions (a part) of the edge surfaces 18 or the second notch 16c are used as the reference.

Accordingly, even though the substrate body 2 includes the plurality of ceramic layers s1a to s1d and s2 and has a slight misalignment generated in a laminating between these ceramic layers, the positional accuracy of each of the via conductors 7 and 8 formed in the substrate body 2 and the first and second conductor layers 5 and 6 individually formed on the surface 3 and the back 4 of the substrate body 2 is high. Therefore, it is also possible to conduct between the first and second conductor layers 5 and 6 and the internal conductor layers that are provided between the ceramic layers s1a to s1d and s2 of the substrate body 2.

A method of manufacturing the first ceramic substrate 1a will be described below.

Figure 12:
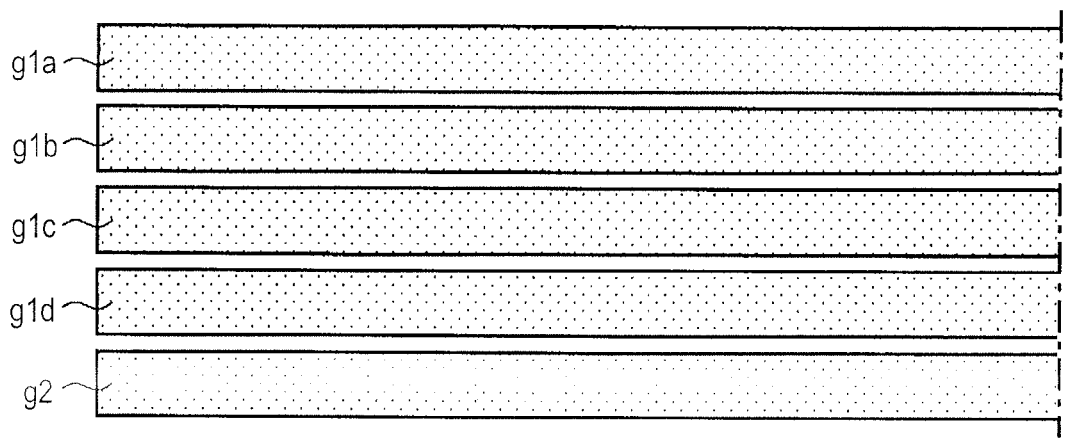
FIG. 12 is a cross-sectional view schematically illustrating one manufacturing process for obtaining the first ceramic substrate.

Ceramic slurry is formed in advance by mixing an adequate amount of a resin binder, a solvent, and the like with alumina powder, and is formed in the shape of a sheet by a doctor blade method. In this way, five green sheets g1a to g1d and g2 are produced as shown in FIG. 12.

Figure 13:
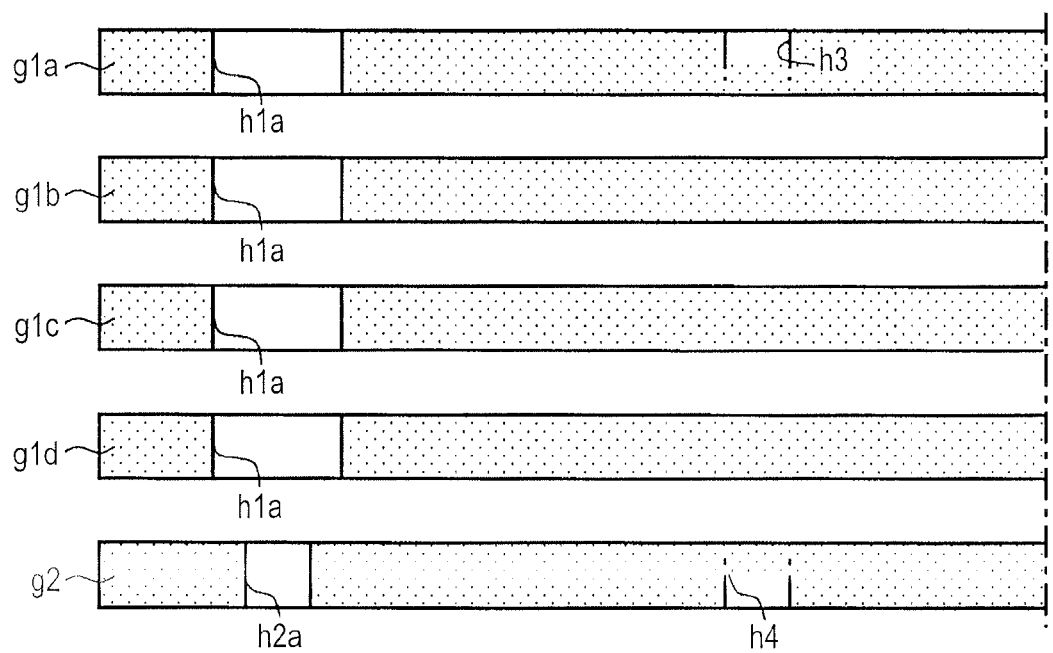
FIG. 13 is a cross-sectional view schematically illustrating a manufacturing process subsequent to FIG. 12.

Next, as shown in FIG. 13, a first through hole h1a, which has a circular shape and a relatively large inner diameter, is formed at each of the corner portions of peripheral portions of the green sheets g1a to g1d, which become the ceramic layers s1a to s1d later, by punching or laser beam machining. Further, through holes h3, which have a relatively small diameter and are used to form the via conductors 7 or the like, are also formed at predetermined positions at the central portions of the green sheets g1a to g1d by laser beam machining.

Meanwhile, at the same time, a second through hole h2a, which has a circular shape and a relatively small inner diameter, is formed at each of the corner portions of the peripheral portion of the green sheet g2, which becomes the ceramic layer s2 later, by punching and through holes h4, which have a relatively small diameter and are used to form the via conductors 8, are also formed at predetermined positions at the central portion of the green sheet g2 by punching.

Meanwhile, the lowermost green sheet g2, which is connected to the via conductors 8 on the back 4 later and on which the second conductor layers 6 having a diameter smaller than the diameter of the first conductor layer 5 formed on the surface 3 of the uppermost green sheet g1a are formed, is used as a reference layer.

Figure 14:
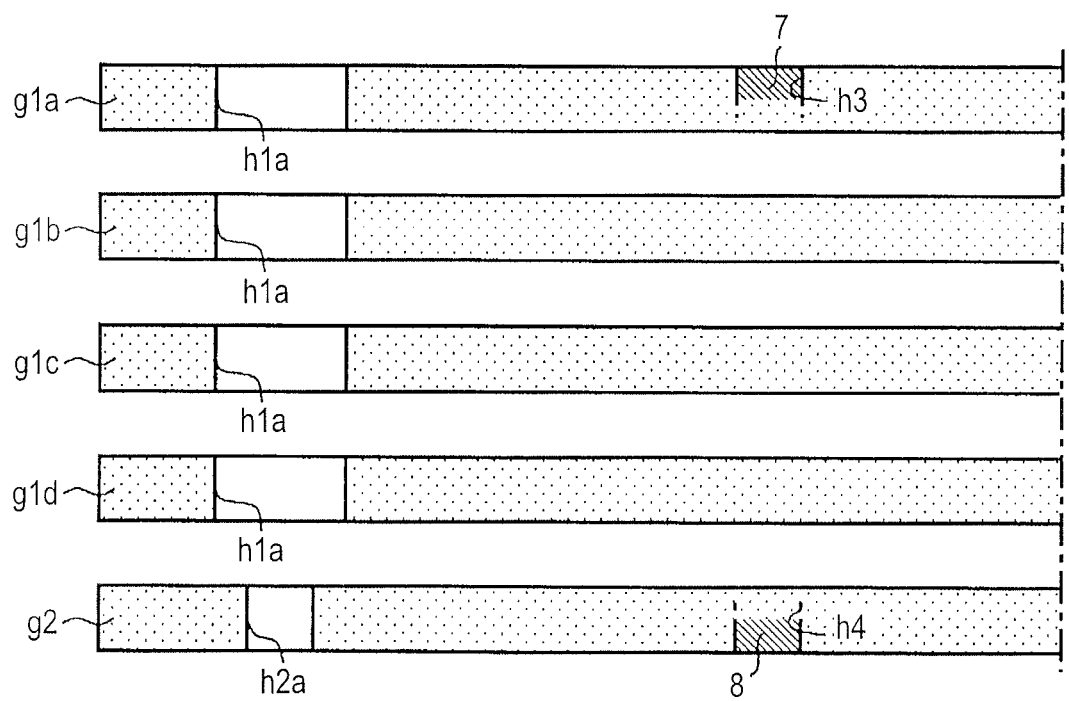
FIG. 14 is a cross-sectional view schematically illustrating a manufacturing process subsequent to FIG. 13.

Then, unfired via conductors (conductor posts) 7 and 8 are formed by filling the through holes h3 and h4 of the outermost green sheets g1a and g2 with a conductive paste that contains W powder, Mo powder, or the like as shown in FIG. 14. Meanwhile, unfired via conductors are formed by also filling the same through holes (not shown) as described above, which are formed in the green sheets g1b to g1d becoming middle layers by punching, with the same conductive paste as described above. Further, unfired internal conductor layers (not shown) are formed by performing screen printing, which uses the same conductive paste as described above, on at least one of the surface and the back of each of the green sheets g1b to g1d.

Figure 15:
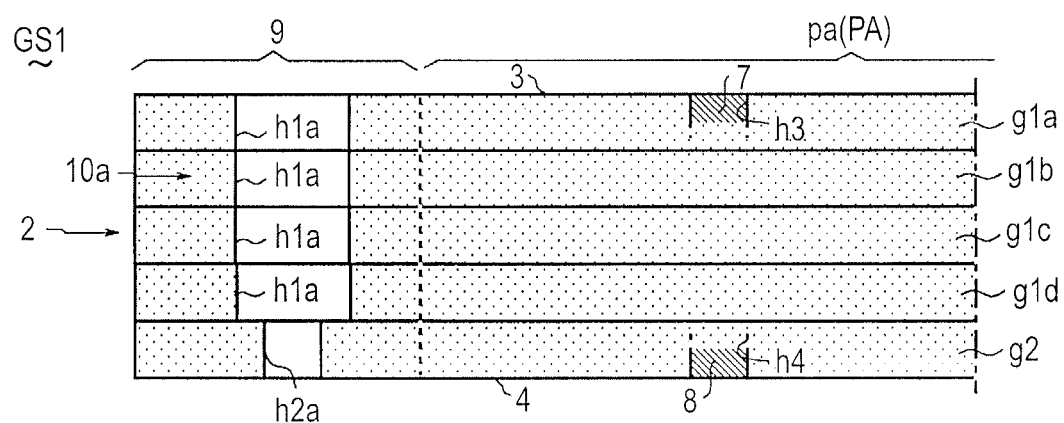
FIG. 15 is a cross-sectional view schematically illustrating a manufacturing process subsequent to FIG. 14.

Furthermore, the above-mentioned five green sheets g1a to g1d and g2 are laminated in the thickness direction as shown in FIG. 15 and are then bonded by pressure. As a result, a green sheet laminate GS1, which includes an unfired substrate body 2, a product region PA including a plurality of wiring substrate regions pa, an edge portion 9, and a plurality of positioning portions 10a, is formed as shown in FIG. 15.

Figures 16A, 16B, 16C:
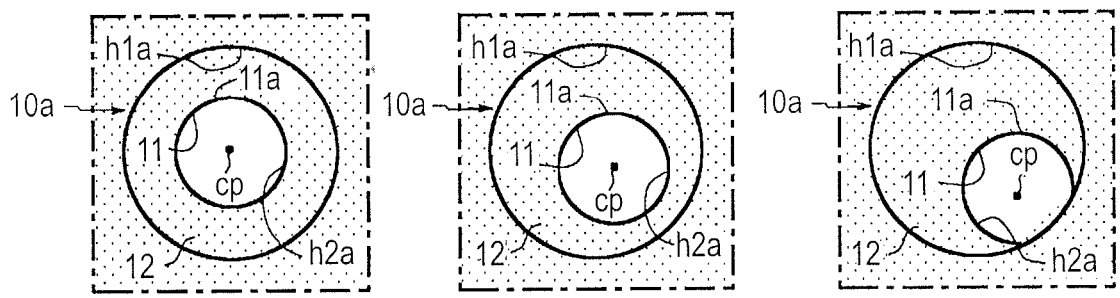
FIGS. 16A to 16C are schematic views showing forms at the time of lamination of a plurality of green sheets.

In the laminating process, it is preferable that a misalignment generated in a laminating do not occur at each of the positioning portions 10a between the five green sheets g1a to g1d and g2 as shown in FIG. 16A so that the centers of the first through holes h1a formed in the green sheets g1a to g1d correspond to the center cp of the second through hole h2a formed in the green sheet g2.

However, due to various technical inevitabilities and the like, as shown in FIG. 16B, there is also a case where a slight misalignment generated in a laminating is accompanied while the entire upper peripheral edge 11a of the second through hole h2a, which is formed in the green sheet g2 and has a center cp, can be seen from the surface 3 in the first through holes h1a formed in the green sheets g1a to g1d.

Moreover, as shown in FIG. 16C, there is also a case where a slight misalignment generated in a laminating is accompanied so that a major portion (a part) of the upper peripheral edge 11a of the second through hole h2a, which is formed in the green sheet g2 and has a center cp, is positioned so as to be capable of being seen from the surface 3 in the first through holes h1a formed in the green sheets g1a to g1d.

However, in this invention, there is no trouble as described below even in the cases of the green sheet laminates GS1 that have the misalignments generated in a laminating shown in FIGS. 16B and 16C.

Figure 17:
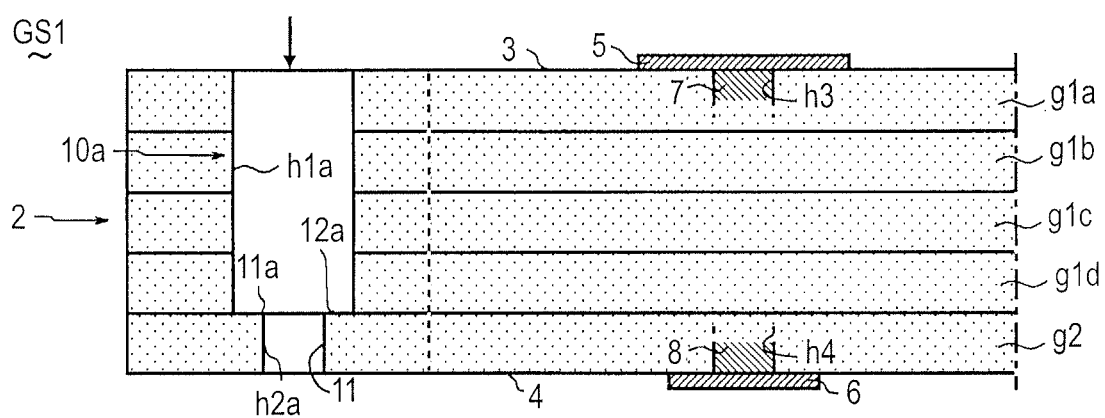
FIG. 17 is a cross-sectional view schematically illustrating a manufacturing process subsequent to FIGS. 15 and 16C.

After that, as shown by a vertical arrow of FIG. 17, the position of the center cp of the second through hole h2a, which is formed in the lowermost green sheet g2 at each of the positioning portions 10a, is detected from the surface 3 of the substrate body 2 by a photo sensor (not shown) or a CCD camera including the photo sensor and image processing. Further, the unfired first and second conductor layers 5 and 6 are individually formed at predetermined positions on the surface 3 and the back 4 by performing screen printing, which uses the same conductive paste as described above, or performing thin film processing through exposure and development at predetermined positions on the surface 3 and the back 4 of the substrate body 2 while the positions of the centers cp at three or more positioning portions 10a are used as the reference. In this case, the formation of the second conductor layer 6 is performed at a posture where the back 4 faces upward.

As a result, since the obtained first and second conductor layers 5 and 6, of which the diameters are different from each other, are substantially accurately formed at the set predetermined positions, the first and second conductor layers 5 and 6 are reliably connected to the via conductors 7 and 8 that are formed in the substrate body 2 in advance.

Further, the green sheet laminate GS1 is fired in a predetermined temperature zone.

Figure 18:
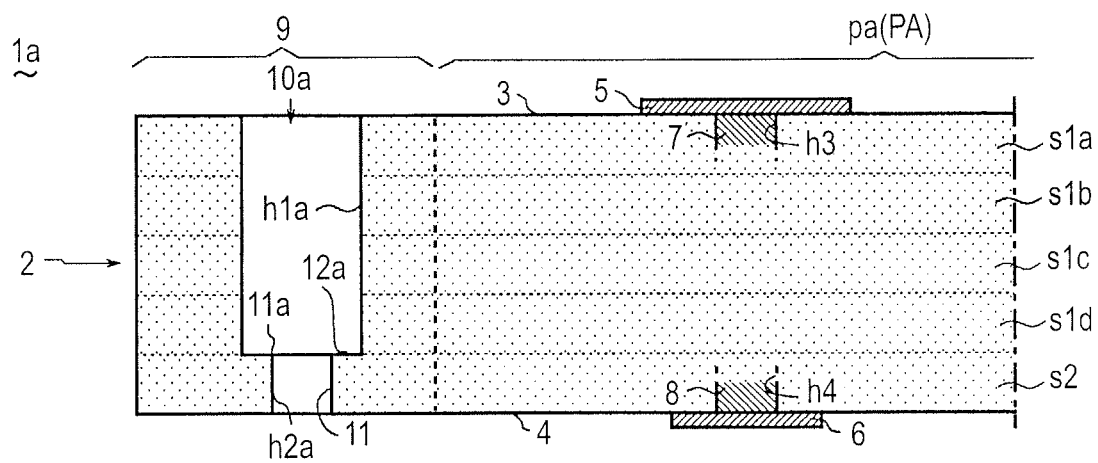
FIG. 18 is a cross-sectional view schematically illustrating a manufacturing process subsequent to FIG. 17 and the first substrate.

As a result, it is possible to obtain the multi-piece ceramic substrate 1a that includes the substrate body 2 including the ceramic layers s1a to std and s2, the product region PA including the plurality of wiring substrate regions pa, the edge portion 9, the plurality of positioning portions 10a, the fired first and second conductor layers 5 and 6, and the fired via conductors 7 and 8 as shown in FIG. 18.

According to the method of manufacturing the above-mentioned ceramic substrate 1a, it is possible to form the positioning portions 10a, which are continuous holes including the first through holes h1a and the second through hole h2a connected to each other, in the plurality of green sheets g1a to g1d and g2 forming the substrate body 2 and to form the first and second conductor layers 5 and 6 at the predetermined positions on the surface 3 and the back 4 of the substrate body 2 by using the centers cp of the second through holes h2a as the reference while securing the connection between the first and second conductor layers 5 and 6 and the via conductors 7 and 8. Accordingly, it is possible to reliably manufacture the first ceramic substrate 1a. In addition, since the second through holes h2a of the positioning portions 10a and the through holes h4 for the via conductors 8 to which the second conductor layers 6 are connected are simultaneously formed in the green sheet g2 used as the reference layer, the positional accuracy of each of the second conductor layers 6 and the via conductors 8 is high and the connection between the second conductor layers 6 and the via conductors 8 is more reliable.

Meanwhile, it is also possible to manufacture the ceramic substrate 1a, which includes any one of the positioning portions 10b to 10d instead of the positioning portion 10a at each of the corner portions of the edge portion 9, by performing the same manufacturing processes as the above-mentioned respective processes.

A method of manufacturing the second ceramic substrate 1b will be described below.

Figure 19:
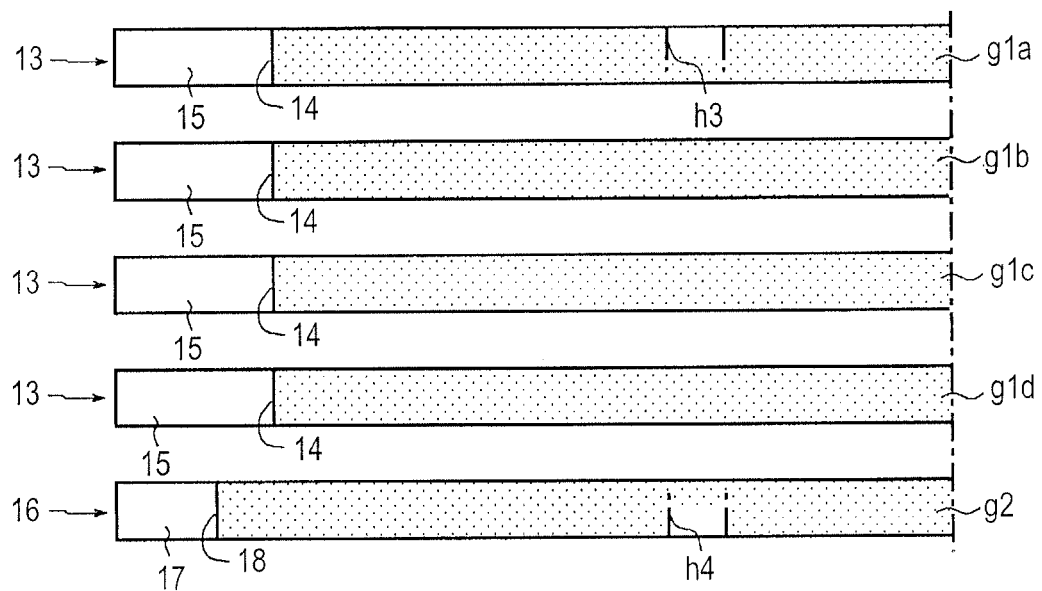
FIG. 19 is a cross-sectional view schematically illustrating one manufacturing process for obtaining the second ceramic substrate.

As shown in FIG. 19, the same five green sheets g1a to g1d and g2 as described above are prepared by the same method as described above.

Next, as shown in FIG. 19, a first notch 13, which has a U shape and a relatively large area of a cut portion in plan view, is formed at each of the corner portions of peripheral portions of the green sheets g1a to g1d, which become the ceramic layers s1a to s1d later, by punching or cutting. Further, through holes h3, which have a relatively small diameter and are used to form the via conductors 7 or the like, are also formed at predetermined positions at the central portions of the green sheets g1a to g1d by the same manner as described above. Meanwhile, at the same time, a second notch 16, which has a U shape and a relatively small area of a cut portion in plan view, is formed at each of the corner portions of the peripheral portion of the green sheet g2, which becomes the ceramic layer s2 later, by punching and through holes h4, which have a relatively small diameter and are used to form the via conductors 8, are also formed at predetermined positions at the central portion of the green sheet g2.

Meanwhile, the lowermost green sheet g2, which is connected to the via conductors 8 on the back 4 later and on which the second conductor layers 6 having a diameter smaller than the diameter of the first conductor layer 5 formed on the surface 3 of the uppermost green sheet g1a are formed, is used as a reference layer.

Figure 20:
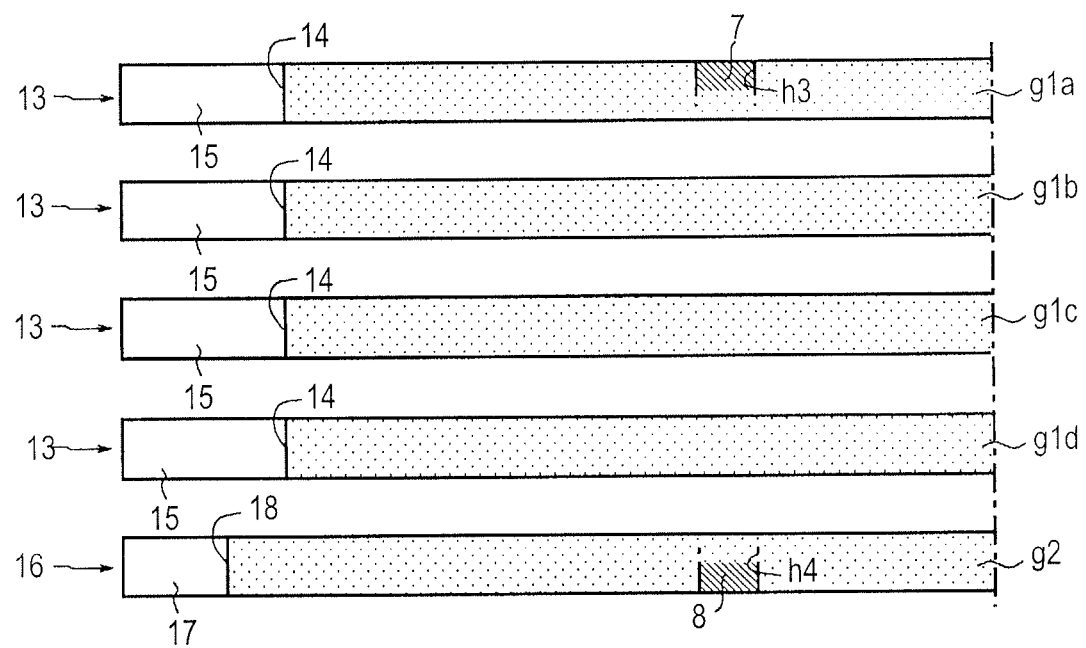
FIG. 20 is a cross-sectional view schematically illustrating a manufacturing process subsequent to FIG. 19.

Then, unfired via conductors (conductor posts) 7 and 8 are formed by filling the through holes h3 and h4 of the outermost green sheets g1a and g2 with a conductive paste that contains W powder, or the like as shown in FIG. 20. Meanwhile, unfired via conductors are formed by also filling the same through holes (not shown) as described above, which are formed in the green sheets g1b to g1d becoming middle layers by punching, with the same conductive paste as described above. Further, unfired internal conductor layers (not shown) are formed by performing screen printing, which uses the same conductive paste as described above, on at least one of the surface and the back of each of the green sheets g1b to g1d.

Figure 21:
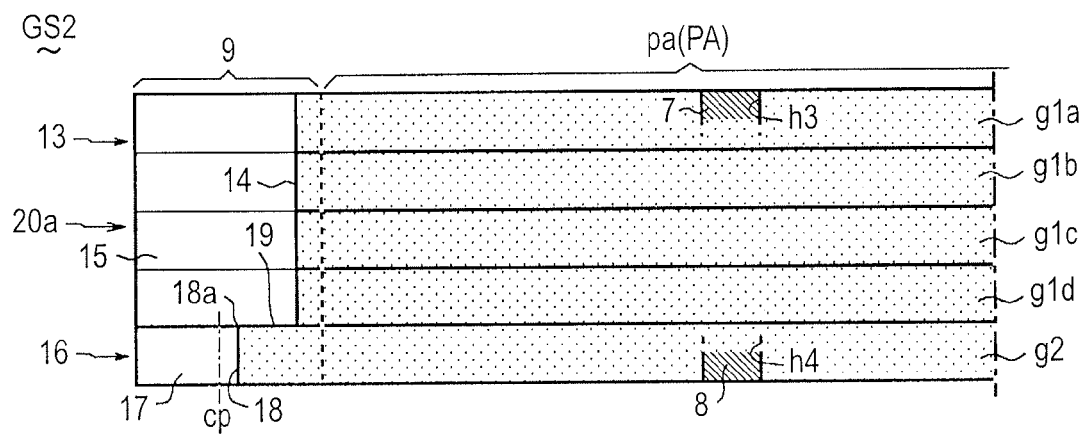
FIG. 21 is a cross-sectional view schematically illustrating a manufacturing process subsequent to FIG. 20.

Furthermore, the above-mentioned five green sheets g1a to g1d and g2 are laminated in the thickness direction as shown in FIG. 21 and are then bonded by pressure. As a result, a green sheet laminate GS2, which includes an unfired substrate body 2, a product region PA including a plurality of wiring substrate regions pa, an edge portion 9, and a plurality of positioning portions 20a, is formed as shown in FIG. 21.

Figures 22A, 22B, 22C:
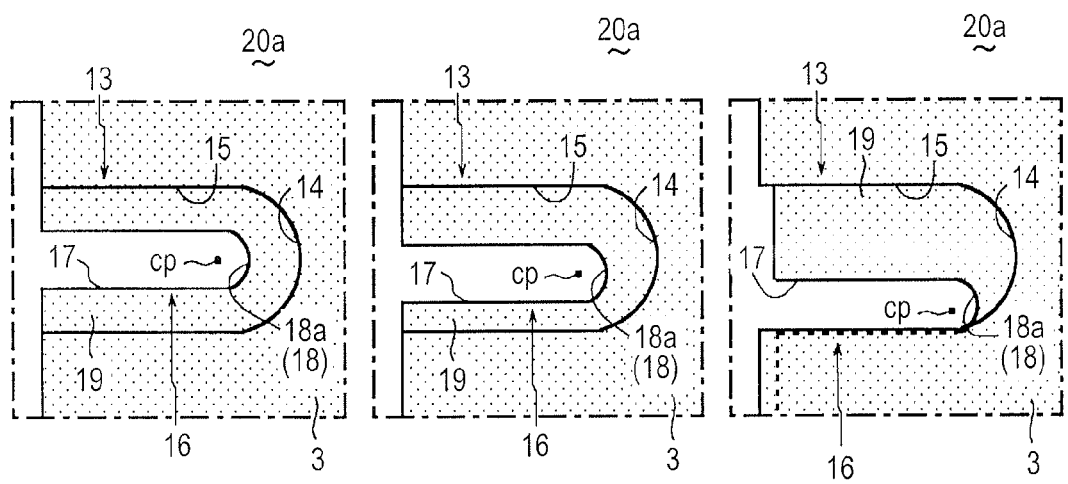
FIGS. 22A to 22C are schematic views showing forms at the time of lamination of a plurality of green sheets.

In the laminating process, it is preferable that a lamination misalignment do not occur at each of the positioning portions 20a between the five green sheets g1a to g1d and g2 as shown in FIG. 22A so that the centers cp of the arc-shaped edge surfaces 14 of the first notches 13 formed in the green sheets g1a to g1d correspond to the center cp of the arc-shaped edge surface 18 of the second notch 16 formed in the green sheet g2.

However, due to various technical inevitabilities and the like, as shown in FIG. 22B, there is also a case where a slight lamination misalignment is accompanied while the entire upper edge side (edge side) 18a of the edge surface 18 of the second notch 16, which is formed in the green sheet g2 and has a center cp, is positioned so as to be capable of being seen from the surface 3 in the first notches 13 formed in the green sheets g1a to g1d.

Moreover, as shown in FIG. 22C, there is also a case where a slight lamination misalignment is accompanied so that a major portion (a part) of the upper edge side 18a of the edge surface 18 of the second notch 16, which is formed in the green sheet g2 and has a center cp, is positioned so as to be capable of being seen from the surface 3 in the first notches 13 formed in the green sheets g1a to g1d.

However, in this invention, there is no trouble as described below even in the cases of the green sheet laminates GS2 that have the lamination misalignments shown in FIGS. 22B and 22C.

Figure 23:
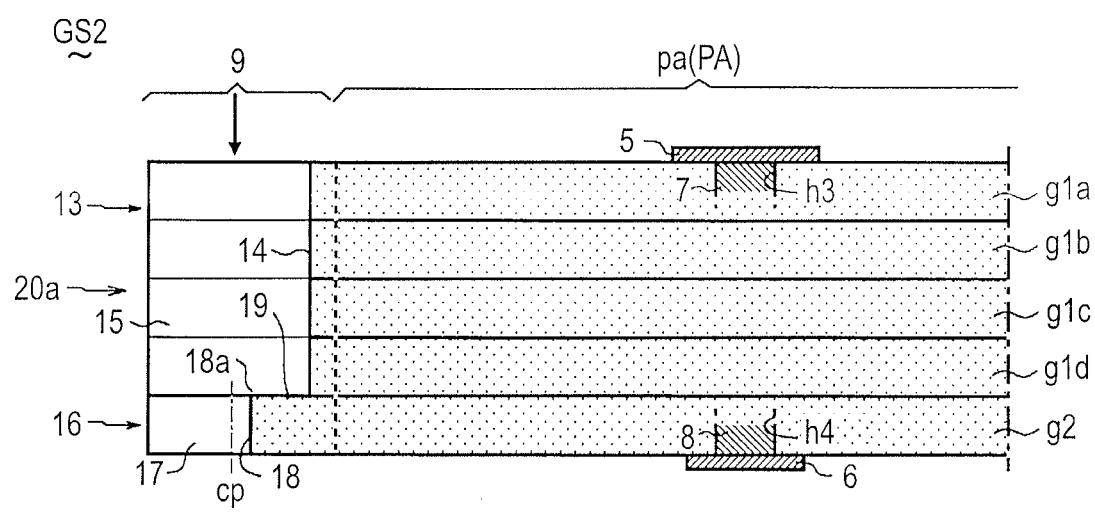
FIG. 23 is a cross-sectional view schematically illustrating a manufacturing process subsequent to FIGS. 21 and 22C.

After that, as shown by a vertical arrow of FIG. 23, the position of the center cp of the edge surface 18 of the second notch 16, which is formed in the lowermost green sheet g2 at each of the positioning portions 20a, is detected from the surface 3 of the substrate body 2 by a photo sensor (not shown) or a CCD camera including the photo sensor and image processing. Further, the unfired first and second conductor layers 5 and 6 are individually formed at predetermined positions on the surface 3 and the back 4 by performing screen printing, which uses the same conductive paste as described above, or performing thin film processing through exposure and development at predetermined positions on the surface 3 and the back 4 of the substrate body 2 while the positions of the centers cp at three or more positioning portions 20a are used as the reference. In this case, the formation of the second conductor layer 6 is performed at a posture where the back 4 faces upward.

As a result, since the obtained first and second conductor layers 5 and 6, of which the diameters are different from each other, are substantially accurately formed at the set predetermined positions, the first and second conductor layers 5 and 6 are reliably connected to the via conductors 7 and 8 that are formed in the substrate body 2 in advance.

Further, the green sheet laminate GS2 is fired in a predetermined temperature zone.

Figure 24:
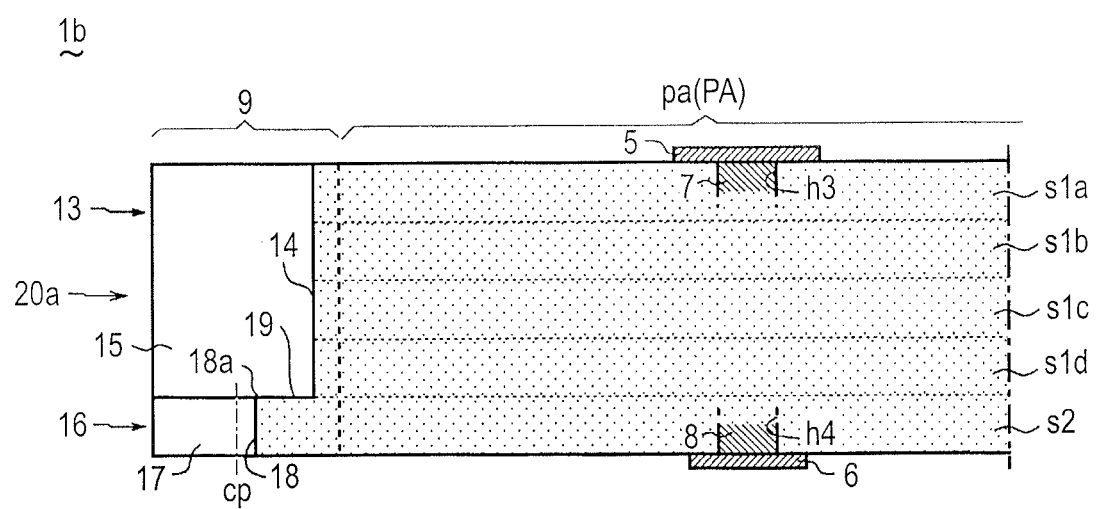
FIG. 24 is a cross-sectional view schematically illustrating a manufacturing process subsequent to FIG. 23 and the second substrate.

As a result, it is possible to obtain the multi-piece ceramic substrate 1b that includes the substrate body 2 including the ceramic layers s1a to std and s2, the product region PA including the plurality of wiring substrate regions pa, the edge portion 9, the plurality of positioning portions 20a, the fired first and second conductor layers 5 and 6, and the fired via conductors 7 and 8 as shown in FIG. 24.

According to the method of manufacturing the above-mentioned ceramic substrate 1b, it is possible to form the positioning portions 20a, which are continuous holes including the first notches 13 and the second notch 16 connected to each other, in the plurality of green sheets g1a to g1d and g2 forming the substrate body 2 and to form the first and second conductor layers 5 and 6 at the predetermined positions on the surface 3 and the back 4 of the substrate body 2 by using the centers cp of the edge surfaces 18 of the second notch 16 as the reference while securing the connection between the first and second conductor layers 5 and 6 and the via conductors 7 and 8. Accordingly, it is possible to reliably manufacture the second ceramic substrate 1b.

In addition, since the second notches 16 of the positioning portions 20a and the through holes h4 for the via conductors 8 to which the second conductor layers 6 are connected are simultaneously formed in the green sheet g2 used as the reference layer, the positional accuracy of each of the second conductor layers 6 and the via conductors 8 is high and the connection between the second conductor layers 6 and the via conductors 8 is more reliable.

Meanwhile, it is also possible to manufacture the ceramic substrate 1b, which includes any one of the positioning portions 20b and 20c instead of the positioning portion 20a at each of the corner portions of the edge portion 9, by performing the same manufacturing processes as the above-mentioned respective processes.

Figure 25:
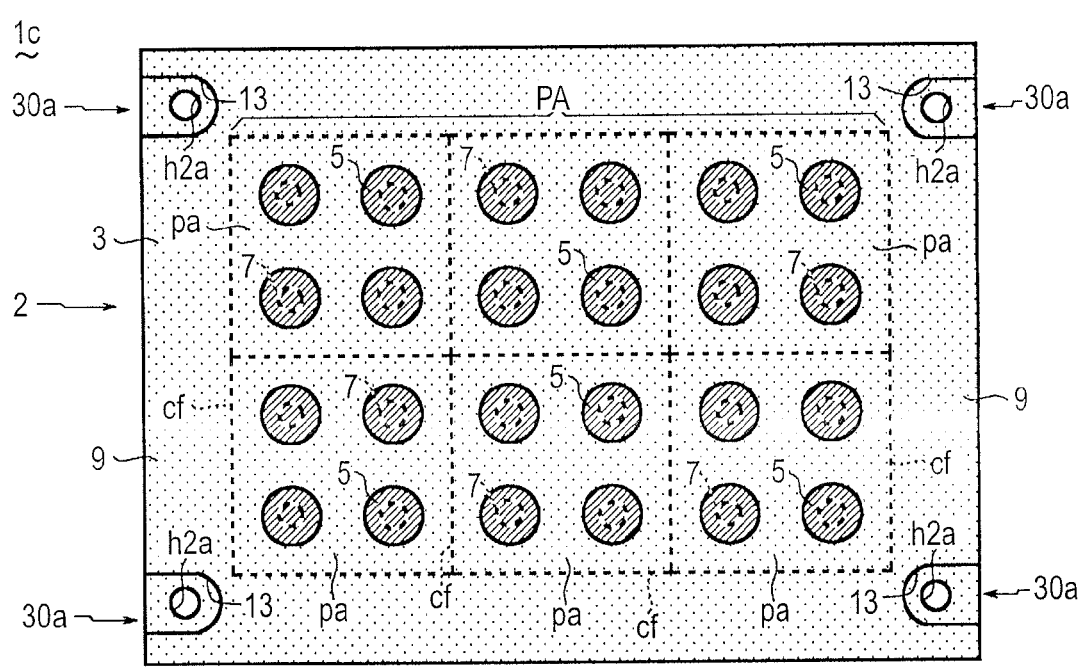
FIG. 25 is a plan view of a third ceramic substrate according to the invention.
Figure 26:
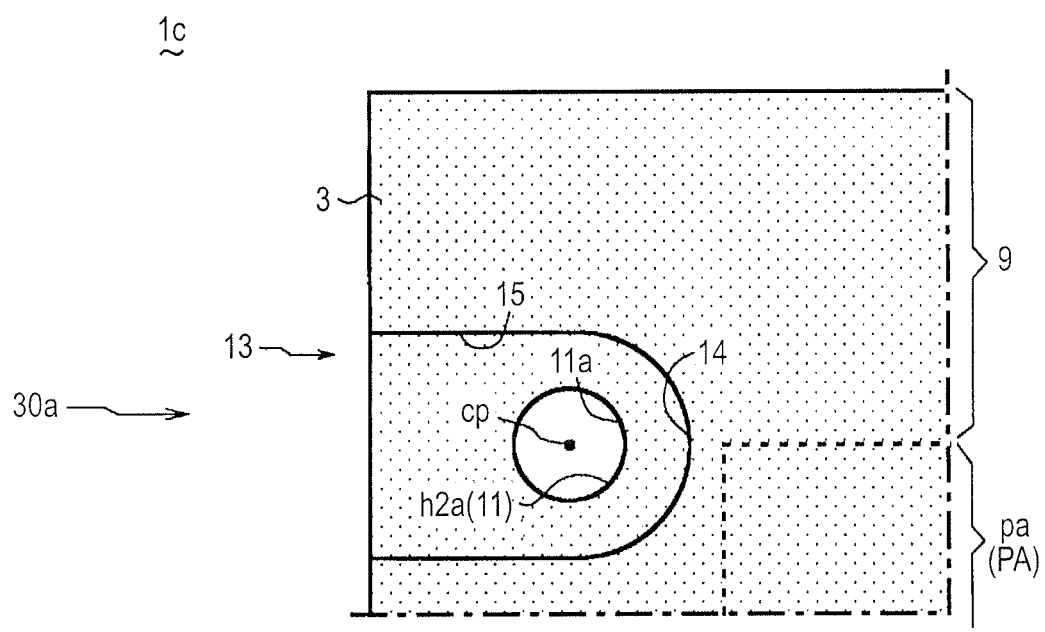
FIG. 26 is a partial plan view where a peripheral portion of the substrate is enlarged.

FIG. 25 is a plan view of a third ceramic substrate 1c according to the invention, and FIG. 26 is a partial plan view where the upper left portion of the ceramic substrate 1c is enlarged.

As shown in FIG. 25, the third ceramic substrate 1c includes a substrate body 2, first conductor layers 5, second conductor layers 6, via conductors 7 and 8, a product region PA including a plurality of ceramic wiring substrate regions pa, an edge portion 9, virtual planes cf to be cut, and a plurality of (four) positioning portions 30a each of which is formed at each corner portion of the edge portion 9. The substrate body 2, the first and second conductor layers 5 and 6, the via conductors 7 and 8, the product region PA, the edge portion 9, and the virtual planes cf are the same as described above.

As shown in FIG. 26, the positioning portion 30a is a stepped portion with a hole that includes notches 13 and a through hole h2a connected to each other in the thickness direction of the respective ceramic layers s1a to s2. The notches 13 and the through hole h2a are individually formed in the respective ceramic layers s1a to s2. Each of the notches 13 has a U shape in plan view, and the through hole h2a has a circular shape in plan view. The cross-sectional area of a cut portion of each notch 13 in plan view is different from the cross-sectional area of the through hole h2a in plan view. When seen from the side, which corresponds to a principal surface 4, of the through hole h2a positioned in the lowermost ceramic layer s2 that includes the principal surface 4 on which the second conductor layers 6 are formed, the cross-sectional area of the through hole h2a is smaller than the area of the cut portion of the notch 13 positioned in the uppermost ceramic layer s1a including a principal surface 3 on which the first conductor layers 5 are formed.

As shown in FIG. 26, at least a part of an upper peripheral edge 11a of an inner peripheral surface 11 of the through hole h2a in plan view can be seen in plan view in a range where the center cp of the through hole h2a positioned in the lowermost ceramic layer s2 including the principal surface 4 on which the second conductor layers 6 are formed can be seen from the principal surface 3 of the uppermost ceramic layer s1a including the principal surface 3 on which the first conductor layers 5 are formed.

Figure 27:
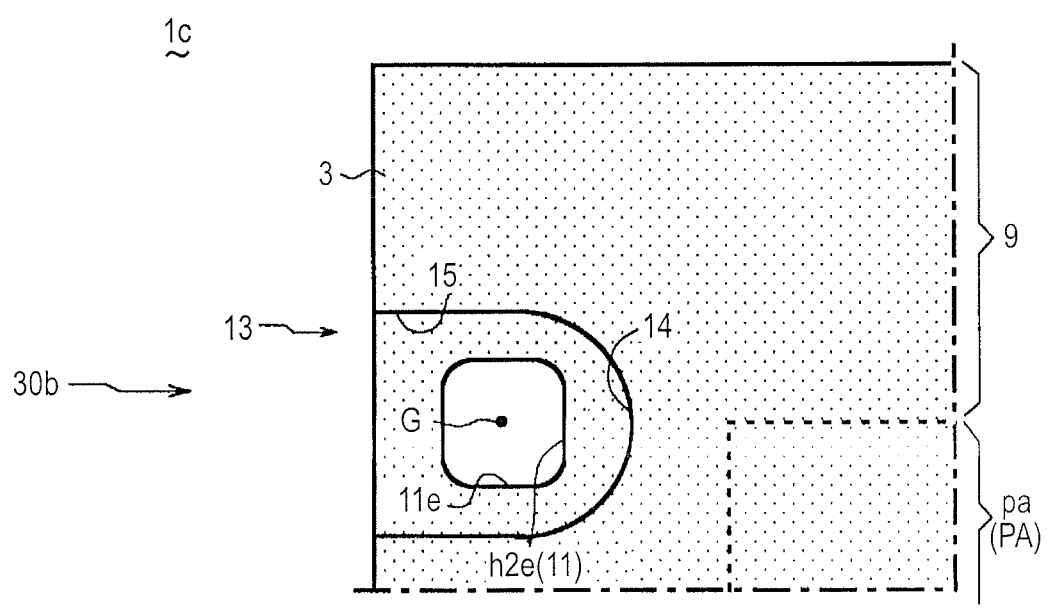
FIG. 27 is an enlarged plan view of a peripheral portion of the substrate where another type of positioning portion is formed.

Further, FIG. 27 is a partial plan view, which is the same as described above, of another type of positioning portion 30b. As shown in FIG. 27, the positioning portion 30b is a stepped portion with a hole that includes notches 13 and a through hole h2e connected to each other in the thickness direction of the respective ceramic layers s1a to s2. The notches 13 and the through hole h2e are individually formed in the respective ceramic layers s1a to s2. Each of the notches 13 has a U shape in plan view, and the through hole h2e has a substantially square shape (a square shape of which the respective corner portions are rounded) in plan view. The cross-sectional area of a cut portion of each notch 13 in plan view is different from the cross-sectional area of the through hole h2e in plan view. When seen from the side, which corresponds to the principal surface 4, of the through hole h2e positioned in the lowermost ceramic layer s2 that includes the principal surface 4 on which the second conductor layers 6 are formed, the cross-sectional area of the through hole h2e is smaller than the area of the cut portion of the notch 13 positioned in the uppermost ceramic layer s1a including a principal surface 3 on which the first conductor layers 5 are formed. Meanwhile, reference letter G in FIG. 27 denotes the centroid of (the inner peripheral surface 11 of) the through hole h2e.

As shown in FIG. 27, at least a part of an upper peripheral edge 11e of the inner peripheral surface 11 of the through hole h2e, which is positioned in the lowermost ceramic layer s2 including the principal surface 4 on which the second conductor layers 6 are formed, in plan view can be seen from the principal surface 3 of the uppermost ceramic layer s1a including the principal surface 3 on which the first conductor layers 5 are formed.

According to the third ceramic substrate 1c that includes any one of the above-mentioned positioning portions 30a and 30b, the first and second conductor layers 5 and 6, which are individually positioned on the surface 3 and the back 4 of the substrate body 2 and individually connected to the conductor posts 7 and 8, are formed while the centers cp of the inner peripheral surfaces 11 of the through holes h2a of the plurality of positioning portions 30a, which can be seen through the notches 13 or directly from the surface 4 of the ceramic layer s2 on which the second conductor layers 6 are formed, the centroids G of the through holes h2e, the centers cp or the centroids G specified by at least major portions (a part) of the inner peripheral surfaces 11 of the through holes h2a at the plurality of positioning portions 30b, or the notches h2e are used as the reference.

Accordingly, even though the substrate body 2 includes the plurality of ceramic layers s1a to s1d and s2 and has a slight misalignment generated in a laminating between these ceramic layers, the positional accuracy of each of the via conductors 7 and 8 formed in the substrate body 2 and the first and second conductor layers 5 and 6 individually formed on the surface 3 and the back 4 of the substrate body 2 is high. Therefore, it is also possible to stably obtain the conduction between the internal conductor layers that are provided between the ceramic layers s1a to s1d and s2 of the substrate body 2.

Meanwhile, positioning portions 30x may be formed using the notch 13c instead of the notch 13 or using the through holes h2b to h2d instead of the through holes h2a and h2e.

Further, it is possible to manufacture the third ceramic substrate 1c, which includes the positioning portions 30x or the positioning portions 30a or 30b, by appropriately using the respective processes of the methods of manufacturing the first and second ceramic substrates 1a and 1b.

Furthermore, the through hole h2e may also be applied to the second through hole of the first ceramic substrate 1a.

The invention is not limited to the respective embodiments described above.

For example, the substrate body 2 may include at least two ceramic layers, that is, an upper ceramic layer and a lower ceramic layer.

Moreover, the ceramic layer of the substrate body 2 may be made of high-temperature fired ceramic, such as mullite or aluminum nitride, or may be made of glass-ceramic that is a kind of low-temperature fired ceramic.

Further, the first and second conductor layers may have a rectangular shape (or a square shape) in plan view. Among them, the length of one side of the square conductor layer is the shortest length, and the length of a short side of the rectangular conductor layer is the shortest length.

Further, the positions of the positioning portions are not limited to the peripheral portion of the multi-piece ceramic substrate, that is, the edge portion, and the positioning portion may be disposed at the peripheral portions of the individual ceramic wiring substrate.

Furthermore, as long as the area of the first through hole is larger than the area of the second through hole in plan view, the first through hole may have a pentagonal shape, a hexagonal shape, an oval shape, an elliptical shape, or the like other than the above-mentioned shape in plan view.

Moreover, as long as the area of the second through hole is smaller than the area of the first through hole in plan view and the centroid of the second through hole can be specified, the second through hole may have a pentagonal shape, a hexagonal shape, an oval shape, an elliptical shape, or the like.

Further, as long as the area of the cut portion of the first notch is larger than the area of the cut portion of the second notch in plan view, the shape of the edge side formed by the edge surface positioned on the inner side may be an arbitrary shape other than the above-mentioned shape.

Furthermore, the area of the cut portion of the second notch is smaller than the area of the cut portion of the first notch in plan view, and the shape of the edge side formed by the edge surface positioned on the inner side or the plurality of edge surfaces may be an arbitrary shape of which the center or the centroid can be specified in plan view.

Moreover, the center or the centroid of one or a plurality of edge surfaces of the second notch may be positioned on the outside of the side surface of the substrate body in plan view.

In addition, the ceramic wiring substrate, which is a product, may be a box-shaped package type wiring substrate that includes cavities on the surface 3 or a wiring substrate for the check of electronic components that is used to check the electrical characteristics of a plurality of electronic components formed on a Si wafer.

According to the invention, it is possible to reliably provide a ceramic substrate that has a small misalignment between the surface and the back of a substrate body made of ceramic and includes conductor layers individually positioned with high positional accuracy.

What is claimed is:

1. A ceramic substrate comprising:
   a substrate body formed by laminating a plurality of ceramic layers and including a first principal surface, a second principal surface on an opposing side of the substrate body from the first principal surface, and a peripheral portion around a periphery of the substrate body in plan view, the peripheral portion having a plurality of positioning portions;
   a first conductor pad formed on the first principal surface;
   a second conductor pad formed on the second principal surface and having a diameter or a shortest length in plan view smaller than that of the first conductor pad; and
   a conductor post connected to at least one of the first conductor pad and the second conductor pad and formed in the substrate body;
   wherein at least one of the plurality of positioning portions defines a continuous hole including a first through hole and a second through hole that are each defined by respective ceramic layers, have different cross-sectional areas, and are in communication with each other in an axial direction,
   wherein the first through hole passes through the first principal surface,
   wherein the second through hole passes through the second principal surface and has a transverse cross-sectional area that is smaller than a transverse cross-sectional area of the first through hole, and
   at least a part of an inner peripheral surface of a ceramic layer defining the second through hole is visible through the first through hole.

2. The ceramic substrate according to claim 1,
   wherein a transverse cross-sectional shape of the second through hole is circular or polygonal.

3. A ceramic substrate comprising:
   a substrate body formed by laminating a plurality of ceramic layers and including a first principal surface, a second principal surface on an opposing side of the substrate body from the first principal surface, and a peripheral portion around a periphery of the substrate body in plan view, the peripheral portion having a plurality of positioning portions;

a first conductor pad formed on the first principal surface;

a second conductor pad formed on the second principal surface and having a diameter or a shortest length in plan view smaller than that of the first conductor pad; and a conductor post connected to at least one of the first conductor pad and the second conductor pad and formed in the substrate body;

wherein at least one of the plurality of positioning portions defines a continuous notch including a first notch and a second notch that are each defined by respective ceramic layers, have different transverse cross-sectional areas, and are in communication with each other in a thickness direction of the respective ceramic layers, wherein the first notch passes through the first principal surface, wherein the second notch passes through the second principal surface and has a transverse cross-sectional area that is smaller than a transverse cross-sectional area of the first notch, and at least a part of an edge surface of a ceramic layer defining the second notch is visible through the first notch.

4. The ceramic substrate according to claim 3, wherein the edge surface of the ceramic layer defining the second notch has an arc-shaped edge side, which is at least one-sixth of a circular shape forming a base in plan view, a semioval edge side, a semi-elliptical edge side, or two or more edge sides crossing each other in plan view.

5. A ceramic substrate comprising:

a substrate body formed by laminating a plurality of ceramic layers and including a first principal surface, a second principal surface on an opposing side of the substrate body from the first principal surface, and a peripheral portion around a periphery of the substrate body in plan view, the peripheral portion having a plurality of positioning portions;

a first conductor pad formed on first principal surface;

a second conductor pad formed on the second principal surface and having a diameter or a shortest length in plan view smaller than that of the first conductor pad; and a conductor post connected to at least one of the first conductor pad and the second conductor pad and formed in the substrate body;

wherein at least one of the plurality of positioning portions includes a stepped portion and a hole including a notch and a through hole which are each defined by respective ceramic layers and are in communication with each other in a thickness direction of the respective ceramic layers, and a transverse cross-sectional area of the notch is different from a transverse cross-sectional area of the through hole, wherein the notch passes through the first principal surface, wherein the through hole passes through the second principal surface and has a transverse cross-sectional area that is smaller than a transverse cross-sectional area of the notch, and at least a part of an inner peripheral surface of a ceramic layer defining the through hole is visible through the notch.

6. A method of manufacturing a ceramic substrate including a substrate body that is made of ceramic and includes a pair of principal surfaces, first and second conductor pads which are individually formed, respectively, on the pair of principal surfaces and of which diameters or shortest lengths in plan view are different from each other, and a plurality of positioning portions that are formed at a peripheral portion of the substrate body in plan view, the method comprising:

forming the first and second conductor pads, of which diameters or the shortest lengths in plan view are different from each other, at predetermined positions on the respective pair of principal surfaces while using a center or a centroid of a through hole or a center or a centroid of an edge surface of a notch of each of the plurality of positioning portions seen in plan view as a reference on each of the pair of principal surfaces.

7. The method according to claim 6, wherein the substrate body is formed by laminating a plurality of ceramic layers, and wherein the positioning portion is:
  a continuous hole including a first through hole and a second through hole that individually pass through a plurality of green sheets forming the respective ceramic layers, have different cross-sectional areas, and are in communication with each other in an axial direction;
  a continuous notch including a first notch and a second notch that are individually formed at a plurality of green sheets forming the respective ceramic layers, have different transverse cross-sectional areas, and are in communication with each other in a thickness direction of the respective green sheets; or
  a stepped portion with a hole including notches and a through hole which are individually formed at the respective ceramic layers and are connected to each other in a thickness direction of the respective ceramic layers, and a transverse cross-sectional area of the notch is different from a transverse cross-sectional area of the through hole.

8. The method according to claim 7, wherein:
  the cross-sectional area of the second through hole is smaller than that of the first through hole; or
  the transverse cross-sectional area of the second notch is smaller than that of the first notch; and wherein the second through hole or the second notch is formed in a green sheet of a reference layer on which the second conductor pads are formed.

9. The method according to claim 8, wherein the second through hole or the second notch, and other through holes which are used to form conductor posts, are simultaneously formed in the green sheet of the reference layer.

10. The method according to claim 8, further comprising:

making at least a part of an inner peripheral surface of the second through hole or at least a part of an edge surface of the second notch is visible through the respective first through hole or the first notch.

* * * * *